(12) United States Patent
Pettes

(10) Patent No.: US 12,237,428 B2
(45) Date of Patent: Feb. 25, 2025

(54) SINGLE PHOTON GENERATION THROUGH MECHANICAL DEFORMATION

(71) Applicant: TRIAD National Security, LLC., Los Alamos, NM (US)

(72) Inventor: Michael Thompson Pettes, Los Alamos, NM (US)

(73) Assignee: Triad National Security, LLC, Los Alamos, NM (US)

( * ) Notice: Subject to any disclaimer, the term of this patent is extended or adjusted under 35 U.S.C. 154(b) by 0 days.

(21) Appl. No.: 18/534,009

(22) Filed: Dec. 8, 2023

(65) Prior Publication Data

US 2024/0372015 A1 Nov. 7, 2024

Related U.S. Application Data

(63) Continuation of application No. 17/025,380, filed on Sep. 18, 2020, now abandoned.

(60) Provisional application No. 62/903,243, filed on Sep. 20, 2019.

(51) Int. Cl.
| | | |
|---|---|---|
| *H01L 33/18* | (2010.01) | |
| *H01L 31/0216* | (2014.01) | |
| *H01L 31/0272* | (2006.01) | |
| *H01L 31/107* | (2006.01) | |
| *H01L 31/18* | (2006.01) | |
| *B82Y 10/00* | (2011.01) | |
| *B82Y 20/00* | (2011.01) | |

(52) U.S. Cl.
CPC .... *H01L 31/02161* (2013.01); *H01L 31/0272* (2013.01); *H01L 31/107* (2013.01); *H01L 31/186* (2013.01); *B82Y 10/00* (2013.01); *B82Y 20/00* (2013.01)

(58) Field of Classification Search
None
See application file for complete search history.

(56) References Cited

U.S. PATENT DOCUMENTS

2019/0288160 A1* 9/2019 Atature .................. H01L 33/32
2021/0109127 A1* 4/2021 Jonker .................. B82Y 20/00
2022/0406962 A1* 12/2022 Xu ....................... H01L 33/0075

* cited by examiner

*Primary Examiner* — Benjamin P Sandvik

(57) ABSTRACT

The present disclosure generally relates to single photon emission from an indirect band gap two-dimensional (2D) material through deterministic strain induced localization. At least some aspects of the present disclosure relate to techniques for deterministically creating spatially localized defect single photon emission sites in the 750 nm to 800 nm regime using a tungsten diselenide ($WSe_2$) film and ultra-sharp $SiO_2$ tips.

20 Claims, 28 Drawing Sheets

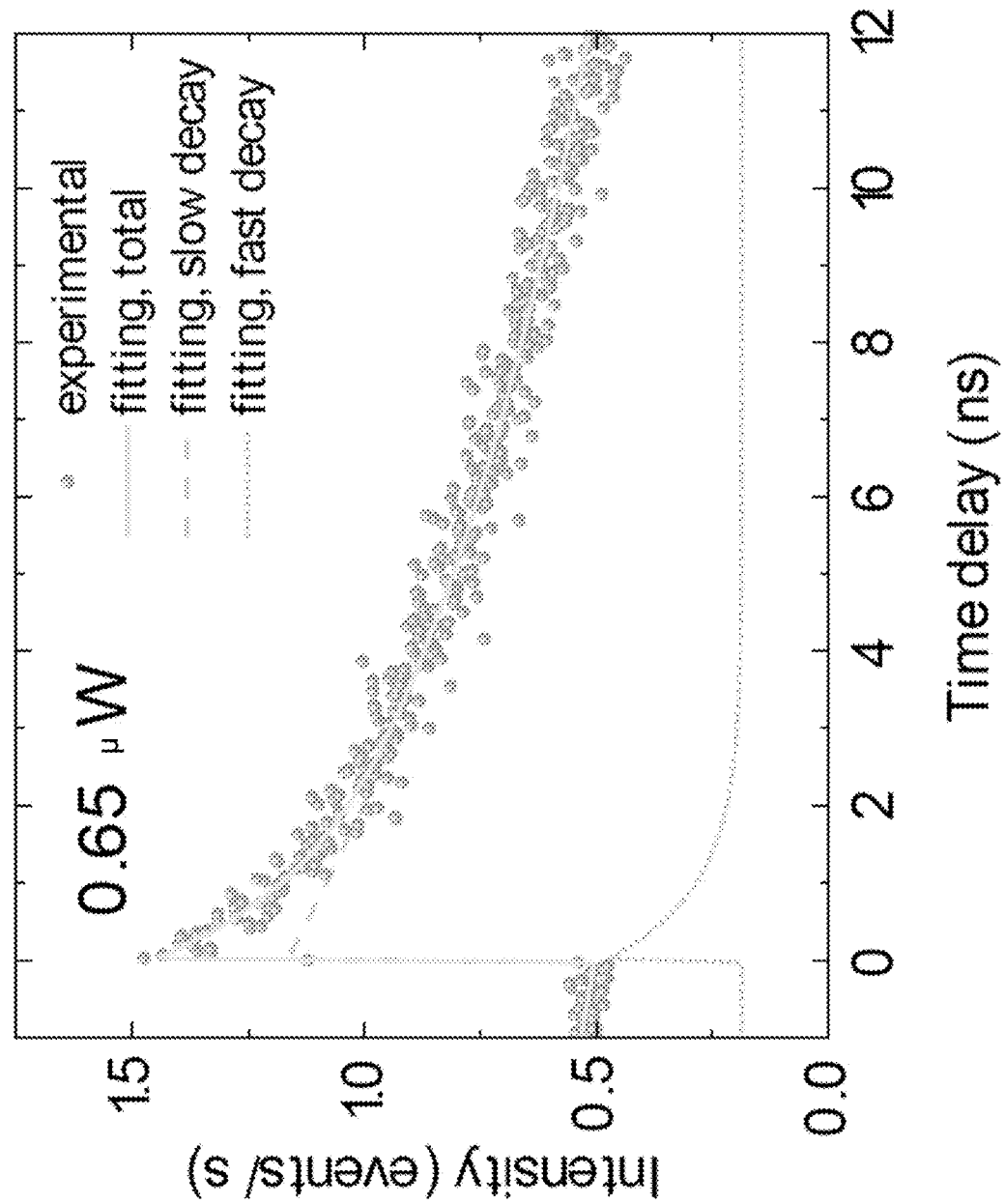

SINGLE PHOTON GENERATION THROUGH MECHANICAL DEFORMATION

RELATED APPLICATIONS

The instant application is a continuation application and claims the benefit and priority to the nonprovisional U.S. application Ser. No. 17/025,380, filed on Sep. 18, 2020, which claims the benefit and priority to the provisional U.S. Application No. 62/903,243 that was filed on Sep. 20, 2019, which are incorporated herein by reference in their entirety.

FEDERALLY SPONSORED RESEARCH OR DEVELOPMENT

The United States government has rights in this invention pursuant to Contract No. 89233218CNA000001 between the United States Department of Energy (DOE), the National Nuclear Security Administration (NNSA), and Triad National Security, LLC for the operation of Los Alamos National Laboratory.

BACKGROUND

Single photon generation is beneficial for quantum key distribution, all-optical quantum computing, and the advancement of quantum information technologies. Beginning with tungsten diselenide ($WSe_2$) in 2015, studies observed single photons originating from defect structures in two-dimensional (2D) materials, such as mechanically exfoliated $WSe_2$, $WS_2$, hexagonal-BN, and GaSe, and in chemical vapor deposition synthesized $WSe_2$ and hexagonal-BN. Optical emission energy in these systems resides within the electronic band gap and excitation had been provided by optical pumping, and electrical charge injection.

Certain studies have postulated that non-uniform strain fields govern quantum emission in these materials, which may benefit secure communication technologies as the use of single photon sources requires both spatial control of the emission site and no more than one emitter per site. However, the mechanism responsible for recent spatial control based on dielectrically non-uniform tent-pole style pillars remains unclear, as does the generality of conclusions based on these studies. Scalability also limits progress: lab-scale mechanical exfoliation and powder vapor transport growth of small crystallites constitute some cases where this effect has been observed in semiconducting 2D materials.

SUMMARY

An aspect of the present disclosure relates to a method for modifying an indirect band gap two-dimensional (2D) film so that it is capable of single photon emission. The method includes providing a 2D film including at least one indirect band gap material, with the 2D film having between 1 and 15 layers; and transferring the 2D film to a substrate including at least a first tip having a radius of about 4 nm, with the transferring rendering the 2D film into a three-dimensional (3D) film capable of single photon emission. In at least some embodiments, the method further includes producing the substrate to have an array of tips each having a radius of about 4 nm, and transferring the 2D film to the substrate having the array of tips. In at least some embodiments, the method further includes producing the substrate to have the array of tips with a distance of about 0.25 μm to about 100 μm between each adjacent tip. In at least some embodiments, transferring the 2D film to the substrate includes transferring the 2D film to the substrate comprising a dielectric material. In at least some embodiments, transferring the 2D film to the substrate including the dielectric material includes transferring the 2D film to the substrate including silicon dioxide ($SiO_2$). In at least some embodiments, transferring the 2D film to the substrate including the least first tip includes transferring the 2D film to the substrate including the least first tip having a base dimension that is double a height dimension of the at least first tip. In at least some embodiments, the method further includes producing a 2D coating material/2D film construct, and transferring the 2D coating material/2D film construct to the substrate. In at least some embodiments, producing the 2D coating material/2D film construct includes spin-coating the 2D film with a coating material. In at least some embodiments, transferring the 2D coating material/2D film construct to the substrate includes positioning the 2D coating material between the 2D film and the substrate. In at least some embodiments, the method further includes, after transferring the 2D film, thermally annealing the 2D film and the substrate to produce a film/substrate construct comprising the 3D film.

Another aspect of the present disclosure relates to a single photon emitting 3D film including a 2D planar portion and a 3D portion in the 2D planar portion, where the 2D planar portion and the 3D portion include at least one indirect band gap material, the 2D planar portion is incapable of single photon emission, and the 3D portion is capable of single photon emission. In at least some embodiments, the at least one indirect band gap material comprises tungsten diselenide ($WSe_2$). In at least some embodiments, the 3D portion has a radius of about 4 nm. In at least some embodiments, the 3D portion has a base dimension that is double a height dimension of the 3D portion. In at least some embodiments, the base dimension is about 0.1 μm to about 20 μm, and the height dimension is about 0.05 μm to about 5 μm.

A further aspect of the present disclosure relates to a single photon emitting sensor component including a 3D film including a 2D planar portion and a 3D portion, the 2D planar portion and the 3D portion including at least one indirect band gap material, the 2D planar portion being incapable of single photon emission, the 3D portion being capable of single photon emission. In at least some embodiments, the at least one indirect band gap material includes tungsten diselenide ($WSe_2$). In at least some embodiments, the 3D portion has a radius of about 4 nm. In at least some embodiments, the 3D portion has a base dimension that is double a height dimension of the 3D portion. In at least some embodiments, the base dimension is about 0.1 μm to about 20 μm, and the height dimension is about 0.05 μm to about 5 μm.

BRIEF DESCRIPTION OF DRAWINGS

For a more complete understanding of the present disclosure, reference is now made to the following description taken in conjunction with the accompanying drawings.

FIG. 5C is a TRPL spectra of localized emission using femtosecond excitation at 540 nm and 0.65 µm, in accordance with embodiments of the present disclosure. Free (fast decay, dotted line) and bound (slow decay, dashed line) represent exciton contributions to a measured event count.

DETAILED DESCRIPTION

Overview

Figure 1A:
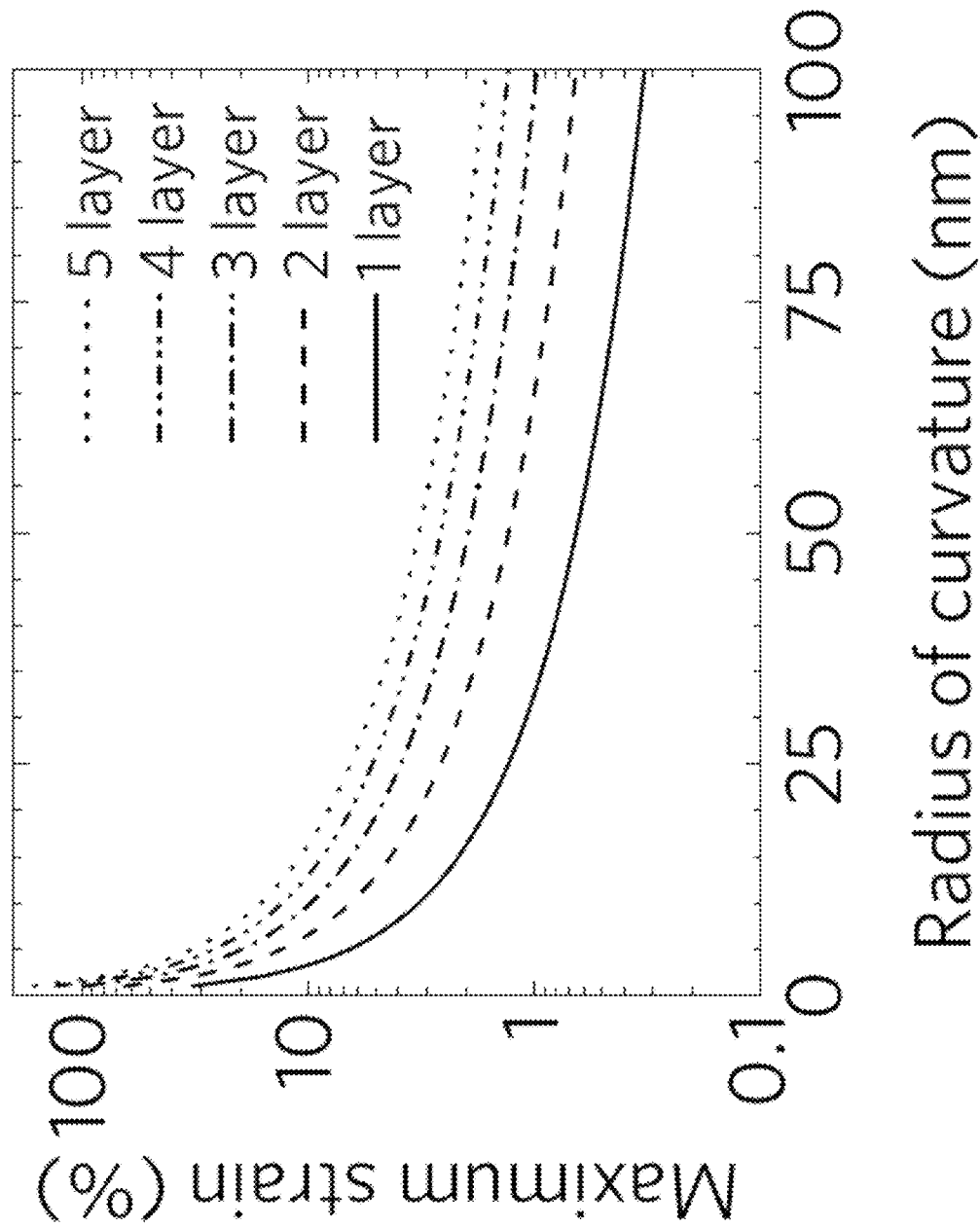
FIG. 1A illustrates calculated maximum strains for epitaxial $WSe_2$ films of differing numbers of layers, in accordance with embodiments of the present disclosure.

Aspects of the present disclosure relate to a three-dimensional (3D) single photon emitting material produced from an indirect band gap two-dimensional (2D) film through deterministic strain induced localization. Additional aspects of the present disclosure relate to a method for producing a 3D single photon emitting material from an indirect band gap 2D film through deterministic strain induced localization.

As used herein, a "indirect band gap 2D film" refers to a 2D film made of one or more indirect band gap materials. Example indirect band gap materials include indirect band gap insulators [such as 2D metal oxides including, but not limited to, molybdenum dioxide ($MoO_2$)] and semiconductors (such as 2D tellurium).

As used herein, "epitaxy" refers to crystal growth or material deposition in which new crystalline layers are formed with a well-defined orientation with respect to a crystalline substrate. Thus, as used herein, an "epitaxial indirect band gap 2D film" refers to an indirect band gap 2D film that is produced from the natural or artificial growth of crystals on a crystalline substrate.

In at least some examples, an indirect band gap 2D film of the present disclosure may be grown in a crystalline manner on an amorphous substrate such as, but not limited to, silicon dioxide ($SiO_2$). For example, an indirect band gap 2D film of the present disclosure may be produced in a similar manner to that described herein above, except switching the substrate from a crystalline one to an amorphous one.

An indirect band gap 2D film of the present disclosure may have as minimal as 1 layer and as many as 15 layers. A layer of the indirect band gap 2D film may be 1 to 5 atoms thick, in at least some examples. In at least some examples, each layer may be about 6.5 Ångström in thickness (in other words about 3 atoms thick). In at least some examples, a layer of the indirect band gap 2D film may be about 1 nm to about 10 nm thick. In at least some examples, an indirect band gap 2D film may be a 2D tungsten diselenide ($WSe_2$) film (in other words a 2D film made of $WSe_2$).

In at least some example, an indirect band gap 2D film may be weakly emitting, meaning it will emit roughly $10^{-5}$-$10^{-3}$ photons per incident photon when irradiated with light.

At least some aspects of the present disclosure relate to techniques for deterministically creating spatially localized 3D sites in an indirect band gap 2D film. A result of such 3D deformation is that the indirect band gap film becomes capable of single photon emission (e.g., in the about 750 nm to about 800 nm regime) at the one or more spatially localized 3D defect sites.

In at least some examples, a localized 3D defect site may be created in an indirect band gap 2D film using an ultra-sharp tip. As used herein, an "ultra-sharp tip" refers to a structure having a tip radius below around 100 nm. In at least some examples, an ultra-sharp tip may have a tip radius of about 3.6 nm.

An ultra-sharp tip of the present disclosure may have varying tip angles. In at least some examples, an ultra-sharp tip may have a tip angle of about 45.6°.

An ultra-sharp tip of the present disclosure may be made of one or more dielectric materials. A dielectric material is an insulating material that is a rather poor conductor of electric current. In at least some examples, an ultra-sharp tip may be made of at least $SiO_2$.

An ultra-sharp tip of the present disclosure may have varying shapes. Example shapes include, but are not limited to, conical, rectangular, square, and annulus (i.e., ring-shaped).

In at least some examples, an ultra-sharp tip may be "large," meaning the ultra-sharp tip has a base dimension of about 0.1 μm to about 10 μm, and a height half of the base dimension.

In at least some examples, an ultra-sharp tip may be chemically etched using one or more chemical etchants. Example isotropic chemical etchants include, but are not limited to hydrofluoric acid (HF) (and more specifically a HF in water solution, and even more specifically a 1% HF in water solution) and buffered oxide etchant (BOE, a HF-based etchant with ammonium fluoride ($NH_4F$), for example in a 1:6 volume ratio).

In at least some examples, an ultra-sharp tip may be etched using a non-isotropic etchant. Example non-isotropic etchants include, but are not limited to, potassium hydroxide (KOH) (and more specifically a KOH solution, and even more specifically a 2.5 M KOH solution) and tetramethyl ammonium hydroxide (TMAH) (and more specifically a 4-25% TMAH in water solution).

Creation of Indirect Band Gap 2D Film In at least some examples, an indirect band gap 2D film may be synthesized by a multi-step diffusion-mediated gas source chemical vapor deposition (CVD) technique. Generally, CVD is a vacuum deposition method used to produce solid materials. A substrate (wafer) is exposed to one or more volatile precursors that react and/or decompose on a surface of the substrate to produce a desired deposit. Volatile by-products may be produced, and removed by gas flow through the reaction chamber. However, one skilled in the art will appreciate that non-CVD techniques may be used to produce an indirect band gap 2D film as described herein.

Reproducibility issues in the synthesis of 2D materials is a significant roadblock to large-scale device integration. In contrast to powder vaporization, CVD-based techniques using gaseous sources offer accessibility for wafer scale integration. But a challenge in this growth is that transition metal precursors have a much lower vapor pressure compared to chalcogen precursors. To this end, in at least some examples, a much higher chalcogen concentration may be used to form stoichiometric transition metal dichalcogenide (TMD) materials. A second challenge is incorporation of contaminants like carbon on a substrate from methyl groups present in an organo-selenium precursor, such as dimethyl selenide [$(CH_3)_2Se$]. In at least some examples, the foregoing (and other) challenges may be solved by using $H_2Se$ as a selenium precursor with a significant amount of excess Se:W ratio of about 26,000:1.

In at least some examples of the present disclosure, a vertical cold-wall CVD reaction scheme may be used. Vertical cold-wall CVD is a type of CVD in which only the substrate (as compared to the reaction chamber) is directly heated either by induction or by passing current through the substrate itself, or a heater in contact with the substrate. The chamber walls may remain at room temperature.

Various substrates may be used. Example substrates include, but are not limited to, c-plane (0001) double-side polished sapphire (Cryscore Optoelectronic Ltd, 99.996% purity, $R_a$ roughness<0.2 nm), $SiO_2$, and hexagonal boron nitride (h-BN). In at least some examples, the substrate may be about 1 $cm^2$. The substrate may be cleaned through rinsing with acetone, 2-propanol, a stabilized formulation of sulfuric acid and hydrogen peroxide compounds (such as that marketed under the trade name Nano-Strip®), and deionized water prior to drying with nitrogen.

In at least some examples, an epitaxial $WSe_2$ film may be synthesized using tungsten hexacarbonyl ($W(CO)_6$, Sigma-Aldrich, 99.99% purity) and hydrogen selenide ($H_2Se$, Matheson, 99.998% purity) in a cold-wall vertical reactor with an inductively heated susceptor (i.e., a material used for its ability to absorb electromagnetic energy and convert it to heat). Example susceptors that may be used include, but are not limited to, a graphite susceptor or a silicon carbide (SiC)-coated graphite susceptor. In at least some examples, $W(CO)_6$ and $H_2Se$ vapor-phase sources may enable control over $WSe_2$ nucleation density and lateral domain growth, which may be beneficial to achieve uniform epitaxial films on sapphire (0001).

Ultra-high purity hydrogen may be used as a carrier gas through bubblers and a reactor. In at least some examples, the ultra-high purity hydrogen may be maintained at a constant flow rate. Example flow rates include, but are not limited to, about 10 sccm to about 2000 sccm. In at least some examples, the reactor may be maintained at a constant pressure. Example pressures of the reactor include, but are not limited to, about 1 mTorr to about 760 Torr. In at least some examples, it may be beneficial for the ultra-high purity hydrogen to be maintained at a constant flow rate of about 450 sccm, and the reactor to be maintained at a constant pressure of about 700 Torr.

$W(CO)_6$ powder may be contained inside a stainless-steel bubbler. The bubbler may be held at constant temperature and pressure. Example temperatures include, but are not limited to, about 20° C. to about 520° C. Example pressures include, but are not limited to, about 10 mTorr to about 760 Torr. In at least some examples, it may be beneficial for the bubbler to be held at about 30° C. and about 730 Torr.

Hydrogen carrier gas may be passed through the bubbler in two stages. In at least some examples, the hydrogen carrier gas may be passed through the bubbler at a faster rate in the first stage as compared to the second stage. In at least some examples, a duration of the first stage may be less than a duration of the second stage.

Generally, during the first stage the hydrogen carrier gas may be passed through the bubbler at a flow rate of about 10 sccm to about 2000 sccm, for about 1 second to about 10 minutes. In at least some examples, during the first stage the hydrogen carrier gas may be passed through the bubbler at a flow rate of about 20 sccm for about 3 minutes, which may result in a $W(CO)_6$ flow rate of about $1.2 \times 10^3$ sccm out of the bubbler.

Generally, during the second stage the hydrogen carrier gas may be passed through the bubbler at a flow rate of about 1 sccm to about 1000 sccm, for about 1 minute to about 1 hour. In at least some examples, during the second stage the hydrogen carrier gas may pass through the bubbler, at a flow rate of about 4.5 sccm for about 45 minutes, which may result in a $W(CO)_6$ flow rate of about $2.8 \times 10^{-4}$ sccm out of the bubbler.

In at least some examples, it may be beneficial for the hydrogen carrier gas to initially be passed through the bubbler at a flow rate of about 20 sccm for about 3 minutes, followed by the hydrogen carrier gas being passed through the bubbler at a flow rate of about 4.5 sccm for about 45 minutes.

The $H_2Se$ flow rate may be held constant during growth of the continuous film of epitaxial $WSe_2$. Example flow rates of the $H_2Se$ flow rate include, but are not limited to, about 1 sccm to about 2000 sccm. In at least some examples, it may be beneficial for the $H_2Se$ to have a flow rate of about 7 sccm.

In at least some examples, the temperature of the substrate may be held constant during growth of the continuous film of epitaxial $WSe_2$. Example temperatures of the substrate include, but are not limited to, about 350° C. to about 1000° C. In at least some examples, it may be beneficial for the temperature of the substrate to be about 800° C.

A significant amount of excess chalcogen:W molar ratio may be used for obtainment of a stoichiometric and uniform 2D epitaxial film, which may be verified by X-ray photoelectron spectroscopy. Chalcogens are the chemical elements in group 16 of the periodic table, and include oxygen (O), sulfur (S), selenium (Se), tellurium (Te), and polonium (Po). Generally, a chalcogen:W molar ratio refers to the ratio of flow rates in terms of moles per minutes. In at least some examples, it may be beneficial to use a chalcogen:W molar ratio of about 26,000:1.

Creation of Ultra-Sharp Tip(s)

In at least some examples, ultra-sharp tips can be fabricated on a planar substrate making for a surface with high aspect ratio features. "High aspect ratio" may be described by sharp features with tip size on the order of about 4 nm to about 100 nm, and heights on the order of about 100 nm to about 10,000 nm. These features, which may include ultra-sharp dielectric tips, may be attached to a, for example, planar silicon-(100) substrate or planar glass substrate that is about 50 µm to about 1000 µm in thickness with an area of roughly 1 cm$^2$ to 707 cm$^2$ in diameter. However, one skilled in the art will appreciate that other techniques may be used to produce a surface with high aspect ratio features for localizing single photon emission through local deformation of an indirect band gap 2D film as described herein.

In contrast with some techniques for transferring 2D materials onto flat substrates (or substrates with low pattern heights), at least some aspects of the present disclosure relate to transferring an indirect band gap 2D film (e.g., a 2D epitaxial $WSe_2$ film) to a single large, etched ultra-sharp tip (or an array of large, etched ultra-sharp tips). In at least some examples, an array of large, etched ultra-sharp tips may be created with separation between adjacent tips on the order of about 0.25 µm to about 100 µm, thereby enabling individual single photon emission sites (of a resulting 3D film) to be optically accessible. In at least some examples, a distance, between each adjacent tip of the array of large, etched ultra-sharp tips, may be about 10 µm. In at least some examples, a large, etched ultra-sharp tip may have a radius on the order of about 4 nm to about 100 nm.

To create an array of large ultra-sharp tips, a single pad, or an array of protective pads (sometimes referred to as a "hard mask" or "sacrificial layer"), are applied to a substrate. The substrate may be a film made of one or more dielectric materials (i.e., insulators). An example dielectric material that may make up the substrate is silicon dioxide ($SiO_2$).

A pad may be made of one or more metals. Example metals include, but are not limited to, chromium (Cr), platinum (Pt), and palladium (Pd). Alternatively, a pad may be made of one or more non-metals. Example non-metals include, but are not limited to, silicon nitride ($Si_3N_4$) and halfnium dioxide ($HfO_2$).

A base of a pad may take various shapes including, but not limited to, circular, rectangular, square, and annulus (i.e., ring-shaped). However, regardless of shape of the base of the pad, it may be beneficial for the pad to have a base dimension that is double a height dimension of the pad. For example, it may be beneficial for a pad to have a base dimension of about 0.1 µm to about 20 µm, and a height half of the base dimension (i.e., about 0.05 µm to about 5 µm).

In at least some examples, it may be beneficial for a pad to have a tip radius (with a tip corresponding to a portion of the pad located distal from the substrate) below around 100 nm. In at least some examples, it may be beneficial for the tip radius to be about 3.6 nm.

A pad may have varying tip angles. A tip angle may refer to an angle measured between two locations located distally apart on a base dimension of the pad. For example, it may be beneficial for a pad to have a tip angle of about 45.6°.

While the array of pads (or single pad) is applied to the substrate (e.g., the $SiO_2$ film), the substrate may be etched using a chemical (and optionally isotropic) etchant. As used herein, "chemical etching" and variations thereof refer to using a chemical etchant to remove portions of the substrate not protected by a pad, resulting in the creation of an ultra-sharp tip substrate having a different ultra-sharp tip positioned where a pad was located on the substrate during the chemical etching process. The ultra-sharp tip substrate may have a same number of ultra-sharp tips as the number of pads used during the chemical etching process. Example chemical etchants include, but are not limited to, potassium hydroxide (KOH) (and more specifically a KOH solution, and even more specifically a 2.5 M KOH solution), tetramethyl ammonium hydroxide (TMAH, and more specifically a 4-25% TMAH in water solution), hydrofluoric acid (HF, and more specifically a HF in water solution, and even more specifically a 1% HF in water solution), and buffered oxide etchant (BOE, a HF-based etchant with ammonium fluoride ($NH_4F$), for example in a 1:6 volume ratio).

The foregoing describes an illustrative top-down approach for creating one or more ultra-sharp tips on a flat substrate. However, the present disclosure is not limited thereto. For example, an ultra-sharp tip(s) may be produced on a flat substrate in a bottom-up manner, such as via growth or 3D printing.

Transfer of 2D Film to Ultra-Sharp Tip(s)

After a herein disclosed 2D film is created, and after an ultra-sharp tip substrate of the present disclosure is created, the 2D film may be transferred to the ultra-sharp tip substrate.

In at least some situations, an ultra-sharp tip of the present disclosure may penetrate a herein disclosed 2D film. Thus, in at least some embodiments, the 2D film may be transferred to the ultra-sharp tip substrate after spin-coating the 2D film with a coating material.

Spin coating is a technique for depositing uniform thin films onto flat substrates. A small amount of coating material is applied on the center of the substrate, which is either spun at low speed or not spun at all. Thereafter, the substrate is rotated to spread the coating material by centrifugal force.

According to the present disclosure, example coating materials for coating the 2D film (deposited on the substrate of the CVD reaction) include, but are not limited to, poly (methyl methacrylate) (PMMA), polycarbonate (PC), polystyrene (PS), polydimethylsiloxane (PDMS), formvar (i.e., thermoplastic resins that are polyvinyl formals, which are polymers formed from polyvinyl alcohol and formaldehyde as copolymers with polyvinyl acetate), or any other sacrificial coating that can be selectively removed either by "peeling" the coating off or by a solvent.

Example rates at which the 2D film may be spun include, but are not limited to, about 500 revolutions per minute (rpm) to about 5000 rpm. In at least some examples, it may be beneficial for the 2D film to be spun at about 1000 rpm.

A coating material may be spun on the 2D film for varying durations of time. Example durations of time include, but are not limited to, about 1 second to about 180 seconds. In at least some examples, it may be beneficial for the coating material to be spun on the 2D film for about 1 minute.

In at least some examples, 950,000 molecular weight PMMA (4% in anisole) may be spin-coated onto a 2D film at about 1000 rpm and for about 1 minute.

A 2D coating material/2D film construct, created from spin-coating, may have varying thicknesses. Example thicknesses include, but are not limited to, about 100 nm to about 10 μm. In at least some examples, a thickness of about 500 nm may be beneficial.

The CVD reaction substrate may be mechanically peeled or chemically etched to release the 2D coating material/2D film construct from the CVD reaction substrate. Example chemical etchants that may be used include, but are not limited to, potassium hydroxide (KOH, and more specifically a KOH solution, and even more specifically a 2.5 M KOH solution), tetramethyl ammonium hydroxide (TMAH, and more specifically a 4-25% TMAH in water solution), hydrofluoric acid (HF, and more specifically a HF in water solution, and even more specifically a 1% HF in water solution), and buffered oxide etchant (BOE, a HF-based etchant with ammonium fluoride ($NH_4F$), for example in a 1:6 volume ratio). In at least some examples, the released 2D coating material/2D film construct may be rinsed, for example in deionized water.

Thereafter, the 2D coating material/2D film construct may be transferred to the ultra-sharp tip substrate. In at least some embodiments, the 2D coating material/2D film construct may be transferred to the ultra-sharp tip substrate such that the 2D film is positioned between the coating material and the ultra-sharp tip substrate. In at least some other embodiments, the 2D coating material/2D film construct may be transferred to the ultra-sharp tip substrate such that the coating material is positioned between the 2D film and the ultra-sharp tip substrate.

After the 2D coating material/2D film construct is transferred to the ultra-sharp tip substrate (or after the 2D film, without a coating material, is transferred to the ultra-sharp tip substrate), the coating material/film and ultra-sharp tip substrate construct (or film/ultra-sharp tip substrate construct) may undergo thermal annealing. Generally, thermal annealing involves heating a material above its recrystallization temperature, maintain a suitable temperature for an appropriate amount of time, and then cooling the material. In annealing, atoms migrate in the crystal lattice of the material, leading to a change in ductility and hardness.

To perform thermal annealing, the coating material/film and ultra-sharp tip substrate construct (or film/ultra-sharp tip substrate construct) may be loaded into a furnace (e.g., a tube furnace). Thereafter, one or more gases may be passed through the furnace to flush the coating material/film and ultra-sharp tip substrate construct (or film/ultra-sharp tip substrate construct) to remove oxygen (known as purging). The one or more gases may include one or more inert gas. Example gases that may be used include, but are not limited to, nitrogen, argon, hydrogen, or a mixture thereof.

The gas(es) may be passed through the furnace at a constant flow rate. Example flow rates include, but are not limited to, about 1 sccm to about 1000 sccm. In at least some examples, it may be beneficial for the gas(es) to have a flow rate of about 100 sccm.

In at least some examples, ultra-high vacuum may be used, without gas(es), to purge the coating material/film and ultra-sharp tip substrate construct (or film/ultra-sharp tip substrate construct) of surface contaminants (such as oxygen and carbonaceous residue). Such ultra-high vacuum may be performed at various pressures including, but not limited to about $10^{10}$ Torr to about $10^{-6}$ Torr. While ultra-high vacuum may be beneficial in at least some situations, it is noted that purging via of ultra-high vacuum could take an order of magnitude longer than purging via a gas(es).

The coating material/film and ultra-sharp tip substrate construct (or film/ultra-sharp tip substrate construct) may undergo purging for various amounts of time. Example amounts of time include, but are not limited to, about 2 minutes to about 2 hours.

After the coating material/film and ultra-sharp tip substrate construct (or film/ultra-sharp tip substrate construct) is purged of surface contaminants, the temperature in the furnace may be increased to an elevated temperature. Example elevated temperatures include, but are not limited to, about 150° C. to about 550° C. In at least some examples, it may be beneficial to increase the temperature to about 400° C.

In at least some examples, increase of furnace temperature from room temperature to the elevated temperature may occur over a duration of time. For example, such increasing of the temperature may take about 30 minutes to about 6 hours. In at least some examples, it may be beneficial to increase the temperature in the furnace over a span of about 3 hours. A slow ramp rate of the furnace temperature may soften the coating material first, thereby ensuring contact between the ultra-sharp tip substrate and the coating material.

After ramping of the temperature, thermal annealing may occur whereby residual coating material (and/or other interfacial contaminants) is removed (due to thermal degradation of the coating material, which may be a polymer in at least some examples) from the film and the ultra-sharp tip substrate, and to improve adhesion of the film to the ultra-sharp tip substrate, thereby creating a conformal 3D film over the ultra-sharp tip substrate. The 2D film may transition (deform) to the 3D film, on the ultra-sharp tip substrate, due to van der Waals adhesion forces between the 2D film and the ultra-sharp tip substrate.

The furnace may be kept at the elevated temperature (and thus thermal annealing may be performed) for various durations of time. Example durations of time include, but are not limited to, about 5 minutes to about 6 hours. In at least some examples, it may be beneficial to perform the thermal annealing for about 1 hour.

In at least some examples, thermal annealing may be performed in the presence of a gas(es). Example gases include, but are not limited to, nitrogen, argon, hydrogen, or a mixture thereof. The gas(es) may be continually flowed through the furnace during the thermal annealing process. The gas(es) may be continually flowed through the furnace at various rates. Example rates include, but are not limited to, about 1 sccm to about 1000 sccm. Moreover, the pressure in the furnace may be maintained during the thermal annealing process. Example pressures include, but are not limited to, about 1 mTorr to about 760 Torr. In at least some examples, it may be beneficial (during the thermal annealing process) for the gas(es) to have a flow rate of about 100 sccm, and the pressure inside the furnace to be about 760 Torr.

Alternatively, during the thermal annealing process, ultra-high vacuum may be used, without gas(es). Such ultra-high vacuum may be performed at various pressures. Example pressures include, but are not limited to, about $10^{10}$ Torr to about $10^{-6}$ Torr.

After thermal annealing, the 3D film/ultra-sharp tip substrate construct may be allowed to cool to room temperature. In at least some examples, a lid of the furnace may be opened while the furnace is at the ramped-to temperature, and the 3D film/ultra-sharp tip substrate construct may be allowed to cool to room temperature by virtue of the furnace lid being opened. In at least some examples, the 3D film/ultra-sharp tip substrate construct may be allowed to cool to room temperature under flow of a gas(es). Example gases include, but are not limited to, nitrogen, argon, hydrogen, or a mixture thereof. In at least some examples, the gas(es) may be continually flowed through the furnace during the cooling process. The gas(es) may be continually flowed through the furnace at various rates. Example rates include, but are not limited to, about 1 sccm to about 1000 sccm.

After the 3D film/ultra-sharp tip substrate construct has cooled to room temperature, 3D film/ultra-sharp tip substrate construct may be removed from the furnace. After removal from the furnace, any remaining coating material may be removed from the 3D film/ultra-sharp tip substrate construct using one or more solvents. Example solvents include organic solvents such as, but not limited to, acetone, chloroform, tetrahydrofuran (THF), and the like.

The 3D film is capable of single photon emission at a location(s) corresponding to the ultra-sharp tip(s) of the ultra-sharp tip substrate. Accordingly, it will be appreciated that an amount of ultra-sharp tips of the ultra-sharp tip substrate, and the positioning of the ultra-sharp tip(s) on the ultra-sharp tip substrate, may be strategically selected based on end use goals.

Creation of 3D Film/Ultra-Sharp Tip Substrate Construct

While the foregoing describes how a 2D film (or 2D coating material/2D film construct) may be transferred to an ultra-sharp tip substrate, the present disclosure is not limited thereto. In at least some embodiments of the present disclosure, a film (having chemical characteristics described herein) may be integrated with (or assembled on) the ultra-sharp tip substrate. For example, a film of the present disclosure may be grown (either directly or indirectly, for example via a coating material) onto the ultra-sharp tip substrate. It will be appreciated that, after the film has been grown onto the ultra-sharp tip substrate (resulting in a film/ultra-sharp tip construct), the film/ultra-sharp tip construct may under purging, thermal annealing, and other processes described herein above to generate a 3D film described above.

Uses of 3D Film/Ultra-Sharp Tip Substrate Constructs

A 3D film of the present disclosure may be used in various manners. For example, the 3D film may be used in an integrated optical circuit [sometimes referred to as a photonic integrated circuit (PIC)], similar to how diamond is used in an integrated optical circuit. An integrated optical circuit is a device that provides functions for information signals imposed on optical wavelengths typically in the visible spectrum or near infrared. Integrated optical circuits may be used in fiber-optic communications, photonic computing, and the biomedical industry. A 3D film of the present disclosure may be used as a wavelength source for information signals in an integrated optical circuit.

A 3D film of the present disclosure may also be used as an active element of a single-photon emission-based sensor (e.g., for measuring magnetic field or temperature).

A 3D film of the present disclosure may additionally be used as a single-photon source for quantum cryptography or other quantum optical circuitry.

EXAMPLES

Transfer of Epitaxial $WSe_2$ Films

When coalesced epitaxial $WSe_2$ film was transferred onto an array of $SiO_2$ tips, one order of magnitude longer bound exciton lifetimes were observed from the tip apex compared to defect emission intrinsic to the film, where both defect types emitted in the about 725 nm to about 810 nm wavelength regime. Narrow linewidth emission was seen arising from 13 out of 15 tips. Single photon generation at the tip apex was confirmed, where single photon purity reached about 70% at 3.8 K.

Figure 1B:
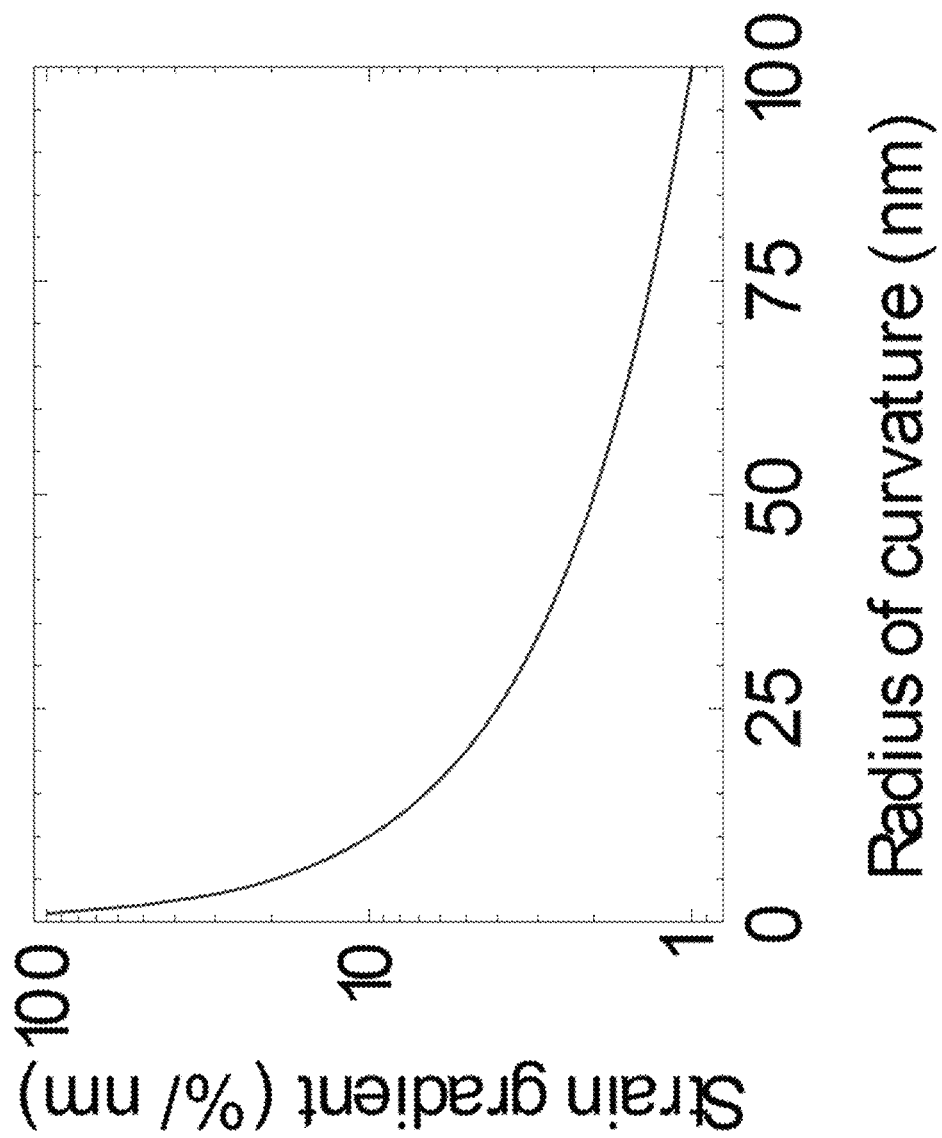
FIG. 1B illustrates a perpendicular strain gradient that may arise on top (tensile) and bottom (compressive) surface of an n-layer $WSe_2$ film as a function of tip radius, in accordance with embodiments of the present disclosure.

Uniaxial and biaxial tensile (compressive) strain reduces (increases) the electronic band gap in 2D TMD materials, such as molybdenum disulfide ($MoS_2$) and $WSe_2$. This may lead to a quantum dot-type energy landscape if strain is applied locally and has been hypothesized to be the mechanism responsible for quantum emission from $WSe_2$ and $WS_2$ transferred onto tent pole-style engineered substrates or patterned surfaces. To separate the effects of mechanical strain from substrate- and/or dielectric-environment induced changes in the local electronic structure, arrays of $SiO_2$ tips were created with well-defined tip radii (i.e., about 4 nm to about 100 nm, and more specifically about 3 nm to about 10 nm). Large 20 μm×20 μm sputtered chromium pads were used as a hard mask while buffered oxide etchant was used to isotropically etch the tips from an about 10 μm-thick CVD SiO$_2$ film deposited onto sub-stoichiometric silicon nitride, which acted as a dielectric etch stop. At the top (bottom) surfaces of the WSe$_2$ film, the tensile (compressive) strain can be estimated as:

$$\varepsilon = h/(2r),\qquad\text{Equation 1}$$

where h is the thickness of the WSe$_2$ film and r is the tip radius. FIGS. 1A and 1B illustrate that by applying Equation 1 to an n=1-5 layer WSe$_2$ film with layer thicknesses of 6.491 Å placed onto a 10-nm radius tip, a maximum strain of 3.2% to 16.2% may arise at the film surface with a strain gradient on the order of $10^{10}\%\,m^{-1}$ perpendicular to the film. This symmetric strain profile thus may have an observable effect on excitonic emission and lifetime, although the true strain experienced may depend on a number of other issues such as compliance and adhesion energy. It is noted that a previous study found an order of magnitude increase in the thermal expansion coefficient ($\alpha$) of several monolayer TMD materials compared to the bulk material. The relationship between $\alpha$ and elastic modulus (E) can be expressed as:

$$\alpha \propto \gamma \rho c_v / E,\qquad\text{Equation 2}$$

where $\gamma$ is the Grüneisen parameter, $\rho$ is the mass density, and $c_v$ is the specific heat. Since $\alpha$ is inversely proportional to E, it is likely that mono- and TMD materials are significantly more compliant than their bulk counterparts and thus more able to be strained by the sharp tips described herein.

Optical Measurements

Figure 2:
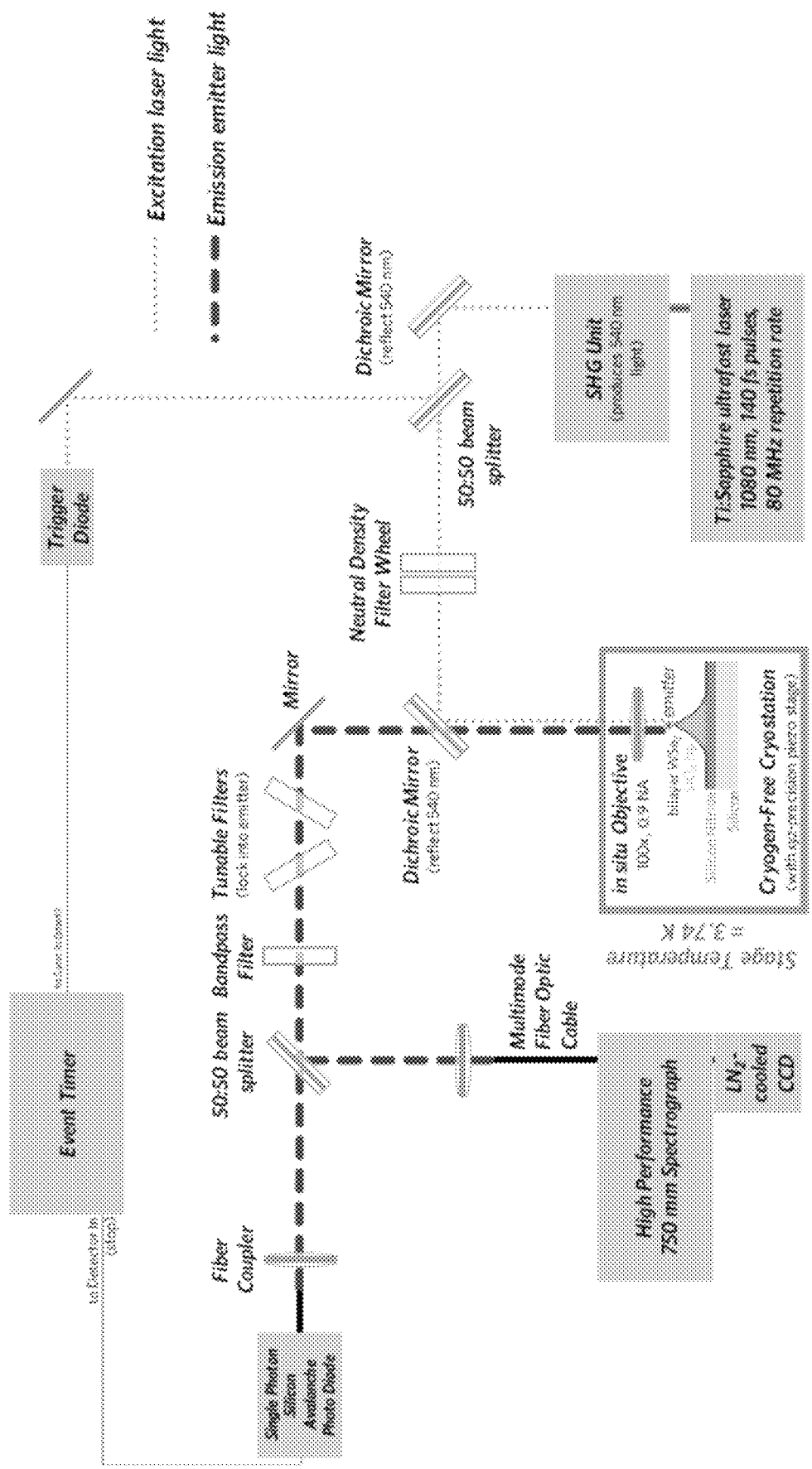
FIG. 2 illustrates an example beam path for a time resolved photoluminescence (TRPL) measurement, in accordance with embodiments of the present disclosure.

In order to determine underlying carrier relaxation dynamics and single photon generation characteristics of a WSe$_2$ film of the present disclosure, ultra-fast optical characterization was performed using a titanium (Ti):Sapphire femtosecond laser for time resolved photoluminescence (TRPL). FIG. 2 illustrates a beam path used for the TRPL measurement. As illustrated in FIG. 2, the excitation beam is depicted using a thin dotted line, and the emitter wavelength (from epitaxial WSe$_2$ film placed on a SiO$_2$ tip) is depicted using a thick dotted line. Emission was about 725 nm to 810 nm.

Figure 3:
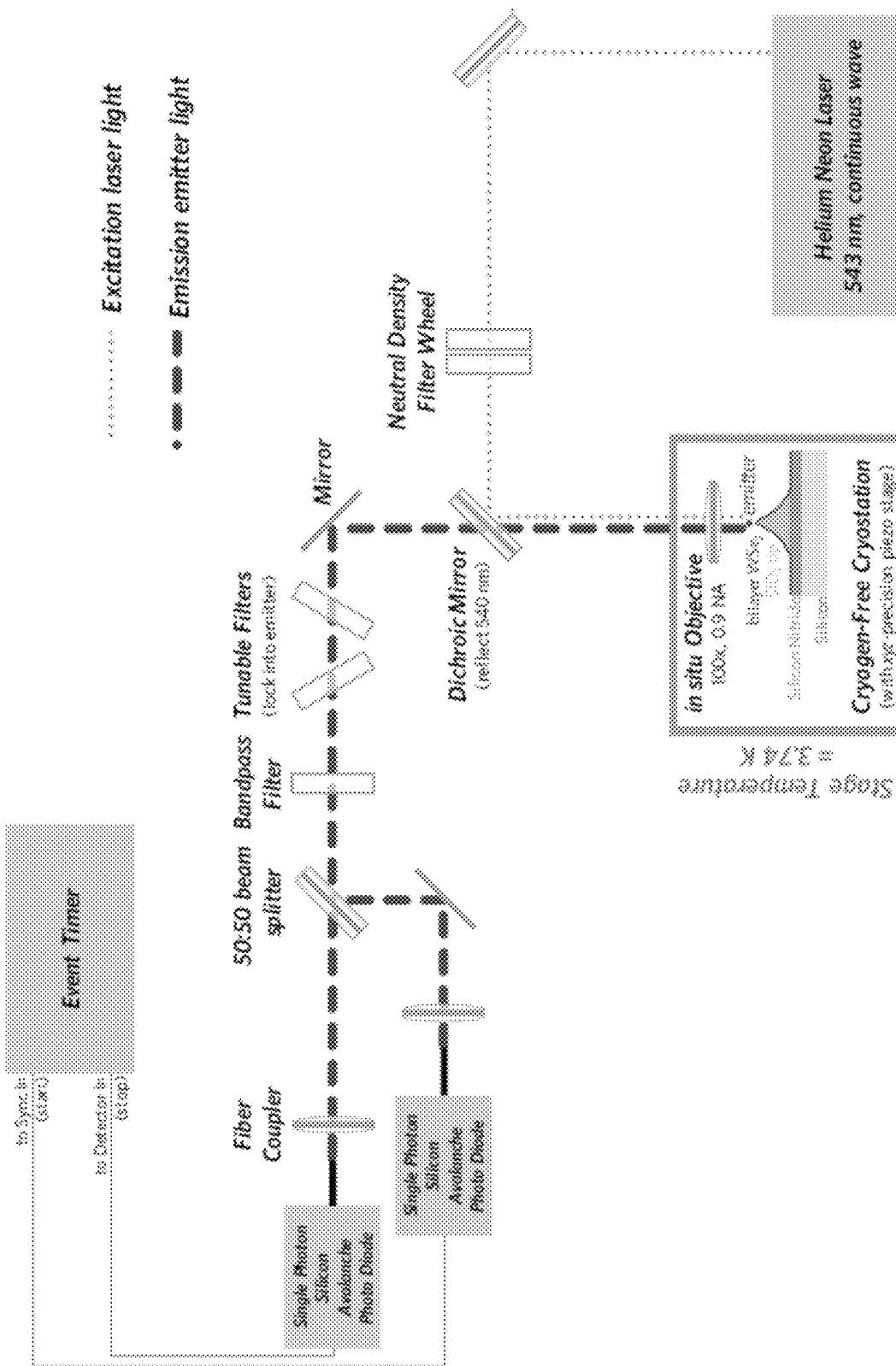
FIG. 3 illustrates an example beam path for a Hanbury Brown-Twiss (NBT) photon correlation measurement, in accordance with embodiments of the present disclosure.

Hanbury Brown-Twiss (HBT) interferometry was also performed using a helium neon (HeNe) continuous wave laser with spectral windows defined by inserting band-pass and tunable long- and short-pass filters into the beam path. FIG. 3 illustrates a beam path for the HBT photon correlation measurement. As illustrated in FIG. 3, the excitation beam is depicted using a thin dotted line, and the emitter wavelength (from epitaxial WSe$_2$ film placed on a SiO$_2$ tip) is depicted in using a thick dotted line. Emission was about 725 nm to 810 nm.

Spatial photoluminescence (PL) emission and Raman spectra of epitaxial WSe$_2$ on a SiO$_2$ tip were obtained using a confocal Raman micro-spectrometer (LabRAM HR Evolution, Horiba Scientific, Ltd.) with 2.33 eV ($\lambda$=532 nm) continuous wave excitation at low power (86 μW) to avoid sample damage and spectral shifts due to local heating effects. A home-built microscope-PL system was used for the TRPL and continuous wave excitation HBT experiments. Ultrafast 540 nm excitation was provided by a Coherent Chameleon Ti:Sapphire femtosecond laser (140 fs, 80 MHz repetition rate) and Coherent VIS module. Continuous wave 543 nm excitation was provided by a Research Electro Optics R-33361 1.5 mW polarized helium-neon laser. The epitaxial WSe$_2$ on a SiO$_2$ tip was placed inside of a Montana Instruments cryogen-free low-vibration cryostation with an Attocube cryogenic precision motion stage and Attocube ANC 300 piezo-controller and in situ 0.9 NA 100× objective. A Princeton Instruments SP2750i high performance imaging spectrograph (750 mm focal length) with a 1200 groove/mm grating [3 point resolution 0.05 nm (0.2 meV) at 543 nm] and PyLon:400BR_eXcelon back illuminated, deep depletion, liquid nitrogen-cooled CCD camera were used to collect PL spectra. The TRPL and HBT measurements were conducted using a PicoQuant HydraHarp 400 multichannel picosecond event timer with TCSPC module and PicoQuant Micro Photon Devices SPD-050-CTD-FC single photon silicon avalanche photodiodes. Optical measurements involved use of Semrock tunable short- and long-pass filters, band pass filters, polarizers, and dichroic mirrors.

Semrock tunable filters were used in all time resolved experiments. Short- and long-pass filters were positioned such that the entire defect emission peak was present in the detection path, which resulted in a band width of about 3 nm. As the count rate was so low, the small amount of non-quantum light that passed through the filtered region into correlation measurements was likely the limiting factor for minimizing the $g^{(2)}(0)$ dip.

Figure 4A:
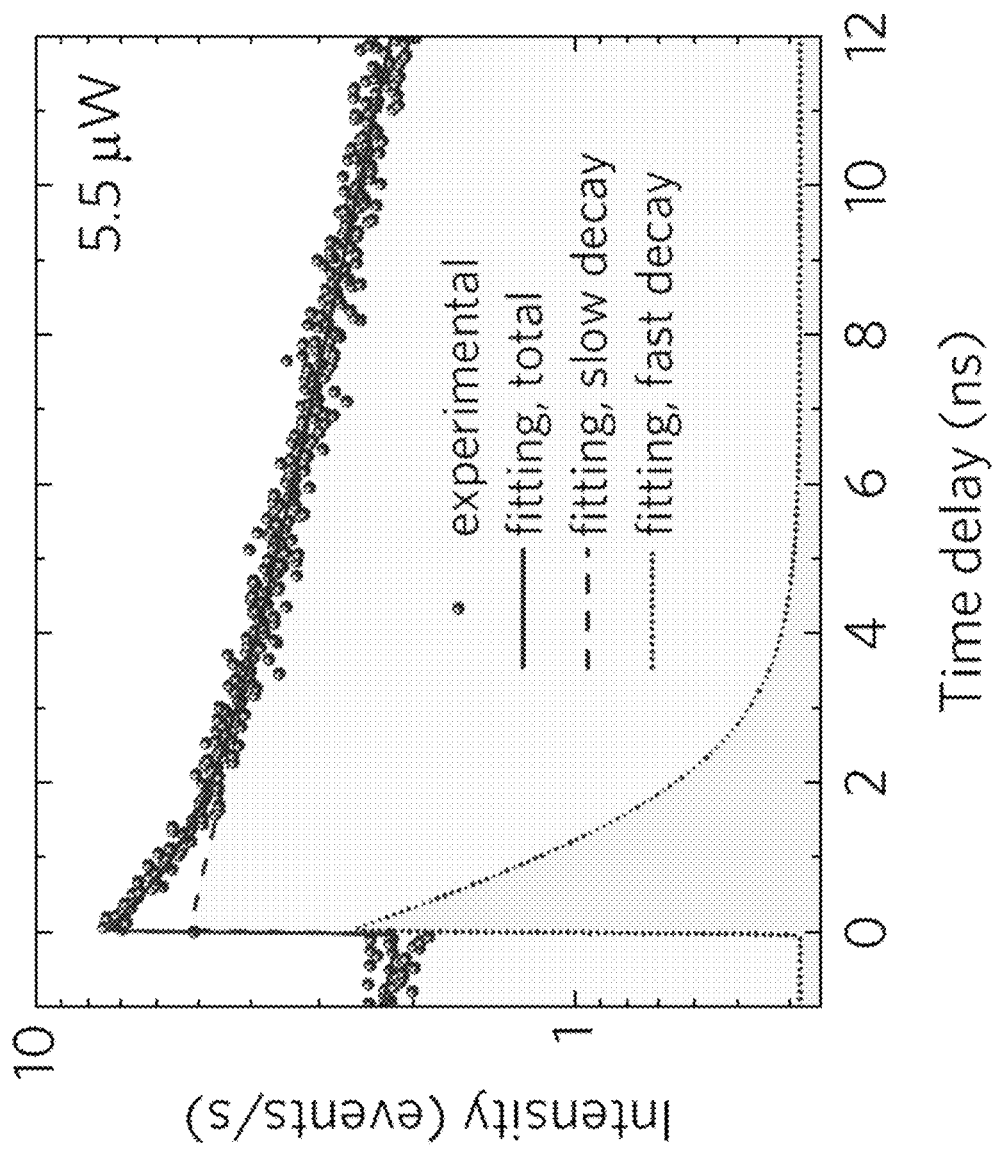
FIG. 4A is a TRPL spectra of localized emission from epitaxial $WSe_2$ on a $SiO_2$ tip obtained using femtosecond excitation at 540 nm and 5.5 µW, in accordance with embodiments of the present disclosure.
Figure 4B:
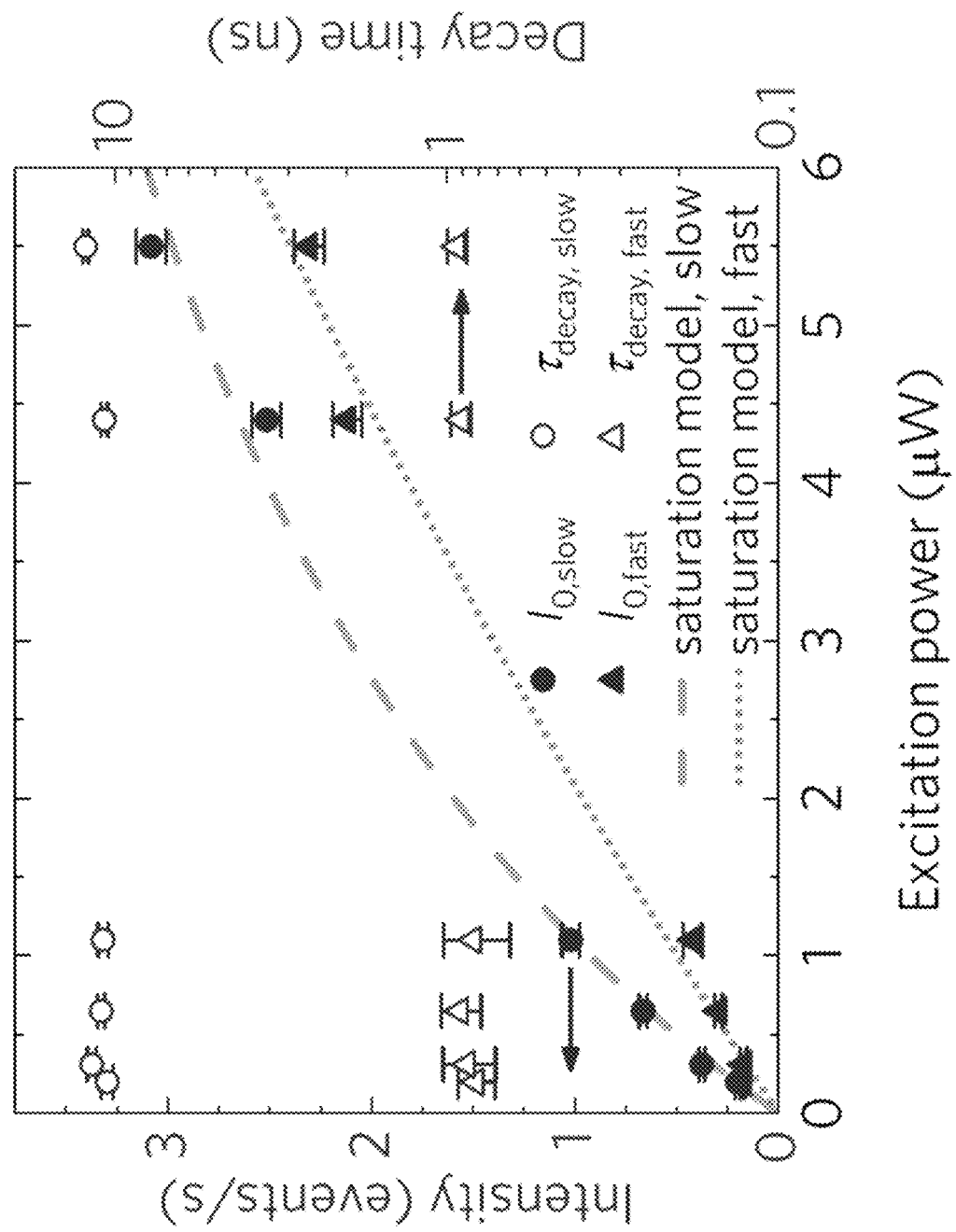
FIG. 4B illustrates bound (slow decay, circles) and free (fast decay, triangles) exciton intensities and decay times obtained from TRPL, in accordance with embodiments of the present disclosure. Error bars are defined by 99% confidence intervals.
Figure 4C:
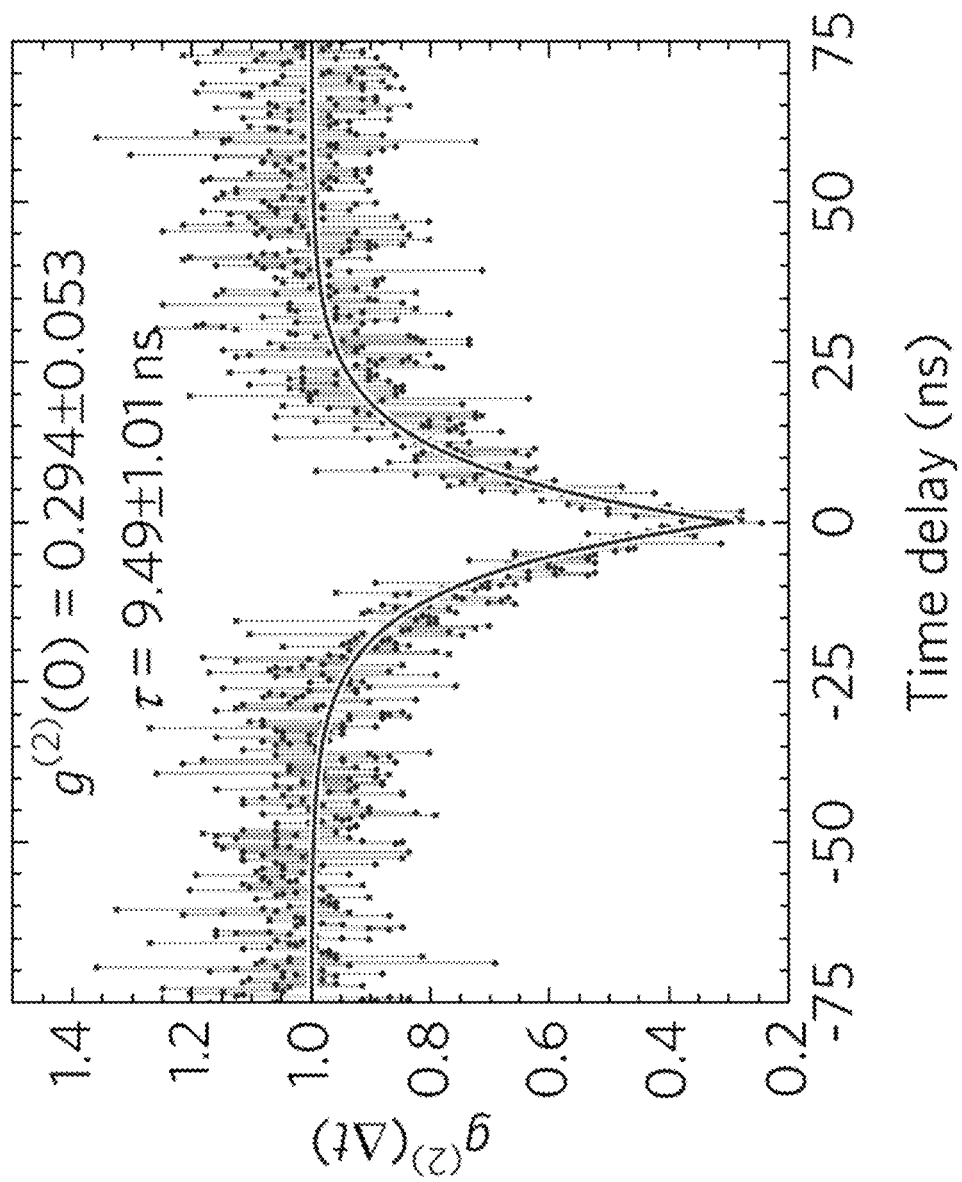
FIG. 4C is a measured second order photon correlation $g^{(2)}(\Delta t)$ as a function of time delay $\Delta t$, in accordance with embodiments of the present disclosure.

Since the free exciton emission will have a faster timescale and scale linearly with power, and the bound exciton emission will have a slower decay time and will show saturation behavior, modeling shown in FIGS. 4A through 4C may be used to understand this behavior. FIG. 4A is a TRPL spectra of localized emission from epitaxial WSe$_2$ on a SiO$_2$ tip obtained using femtosecond excitation at 540 nm and 5.5 μW. FIG. 4B illustrates bound (slow decay, circles) and free (fast decay, triangles) exciton intensities and decay times obtained from TRPL. Error bars in FIG. 4B are defined by 99% confidence intervals. FIG. 4C is a measured second order photon correlation $g^{(2)}(\Delta t)$ as a function of time delay $\Delta t$.

Figure 5A:
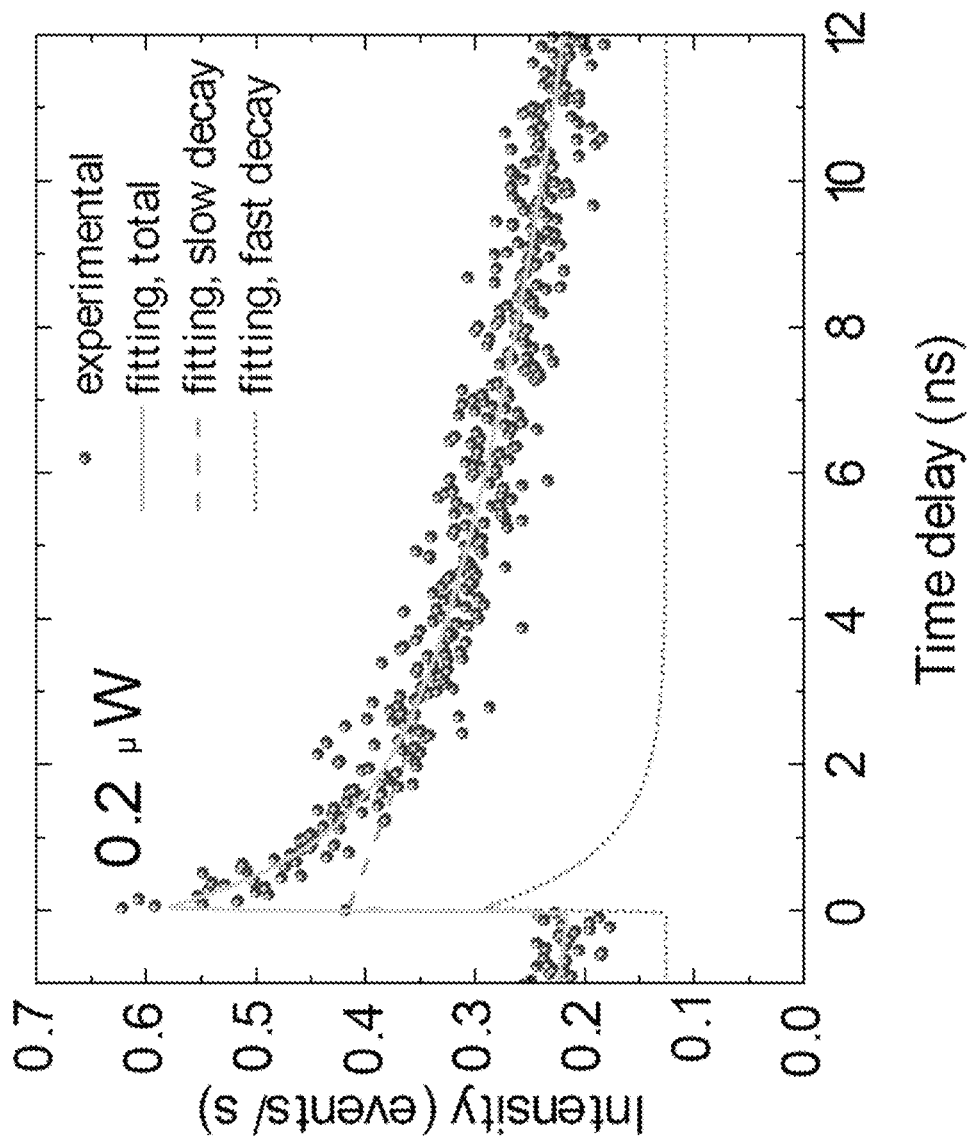
FIG. 5A is a TRPL spectra of localized emission using femtosecond excitation at 540 nm and 0.20 µm, in accordance with embodiments of the present disclosure. Free (fast decay, dotted line) and bound (slow decay, dashed line) represent exciton contributions to a measured event count.
Figure 5B:
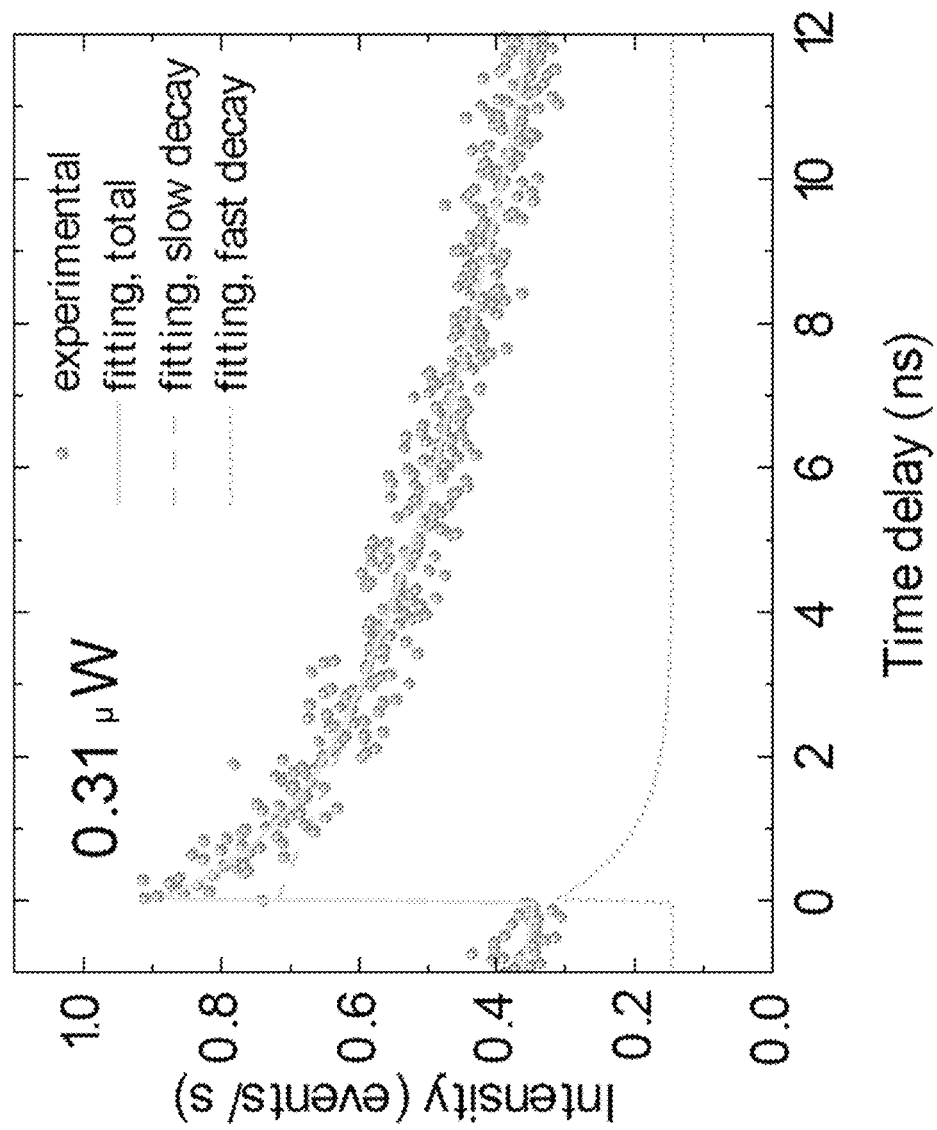
FIG. 5B is a TRPL spectra of localized emission using femtosecond excitation at 540 nm and 0.31 µm, in accordance with embodiments of the present disclosure. Free (fast decay, dotted line) and bound (slow decay, dashed line) represent exciton contributions to a measured event count.
Figure 5D:
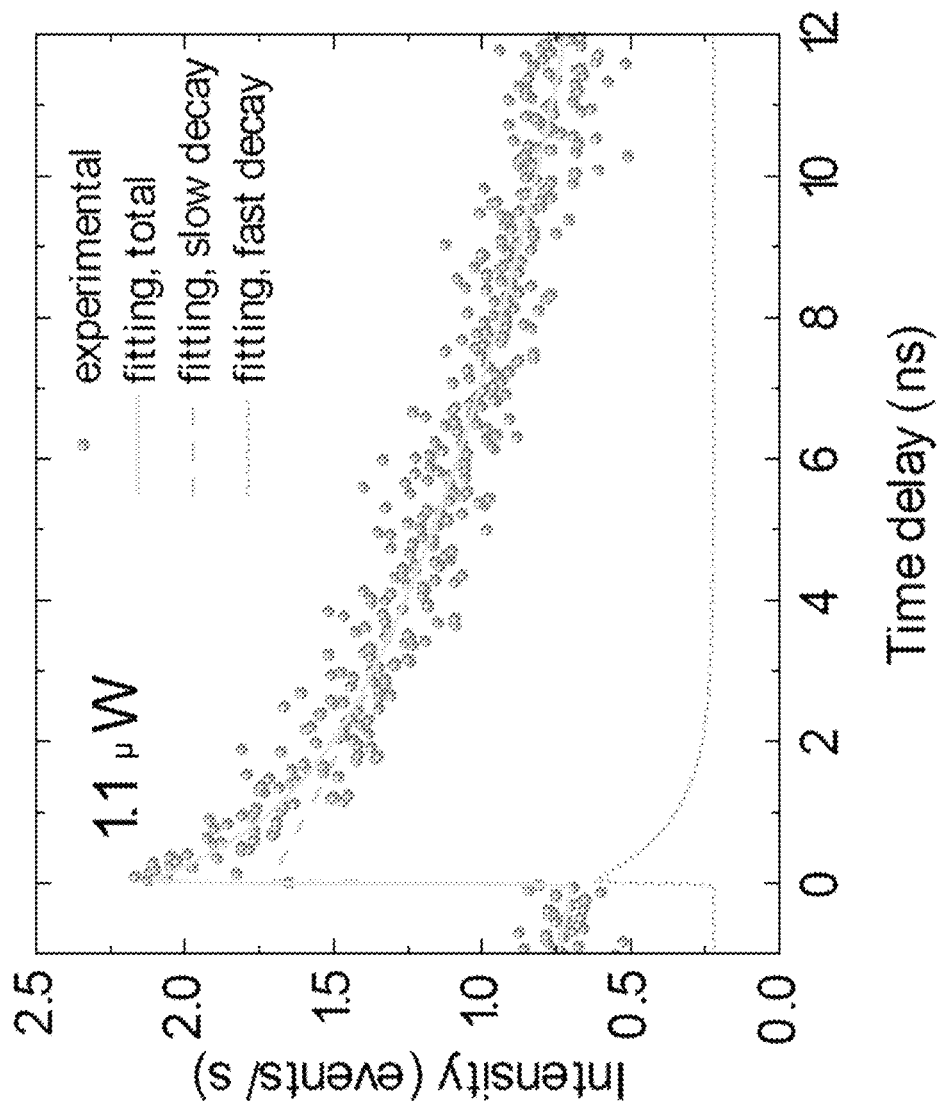
FIG. 5D is a TRPL spectra of localized emission using femtosecond excitation at 540 nm and 1.1 µm, in accordance with embodiments of the present disclosure. Free (fast decay, dotted line) and bound (slow decay, dashed line) represent exciton contributions to a measured event count.
Figure 5E:
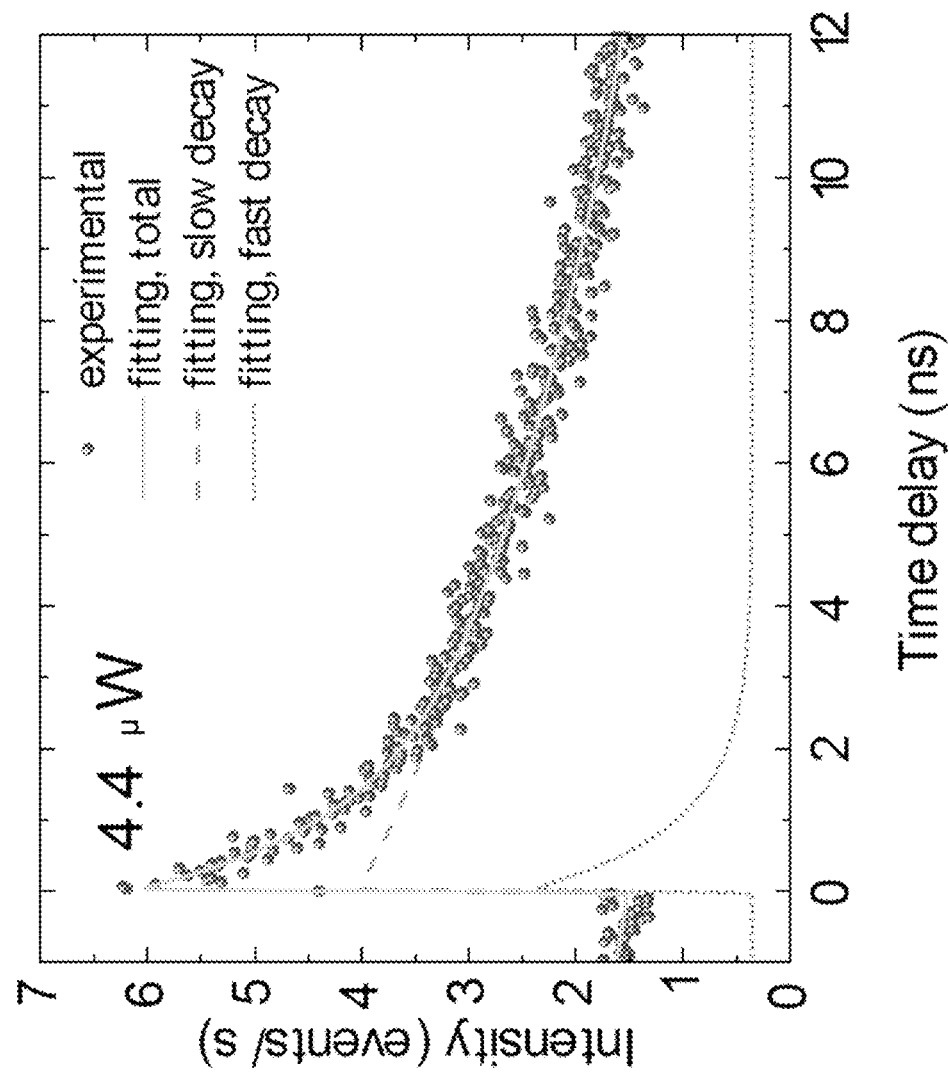
FIG. 5E is a TRPL spectra of localized emission using femtosecond excitation at 540 nm and 4.4 µm, in accordance with embodiments of the present disclosure. Free (fast decay, dotted line) and bound (slow decay, dashed line) represent exciton contributions to a measured event count.
Figure 5F:
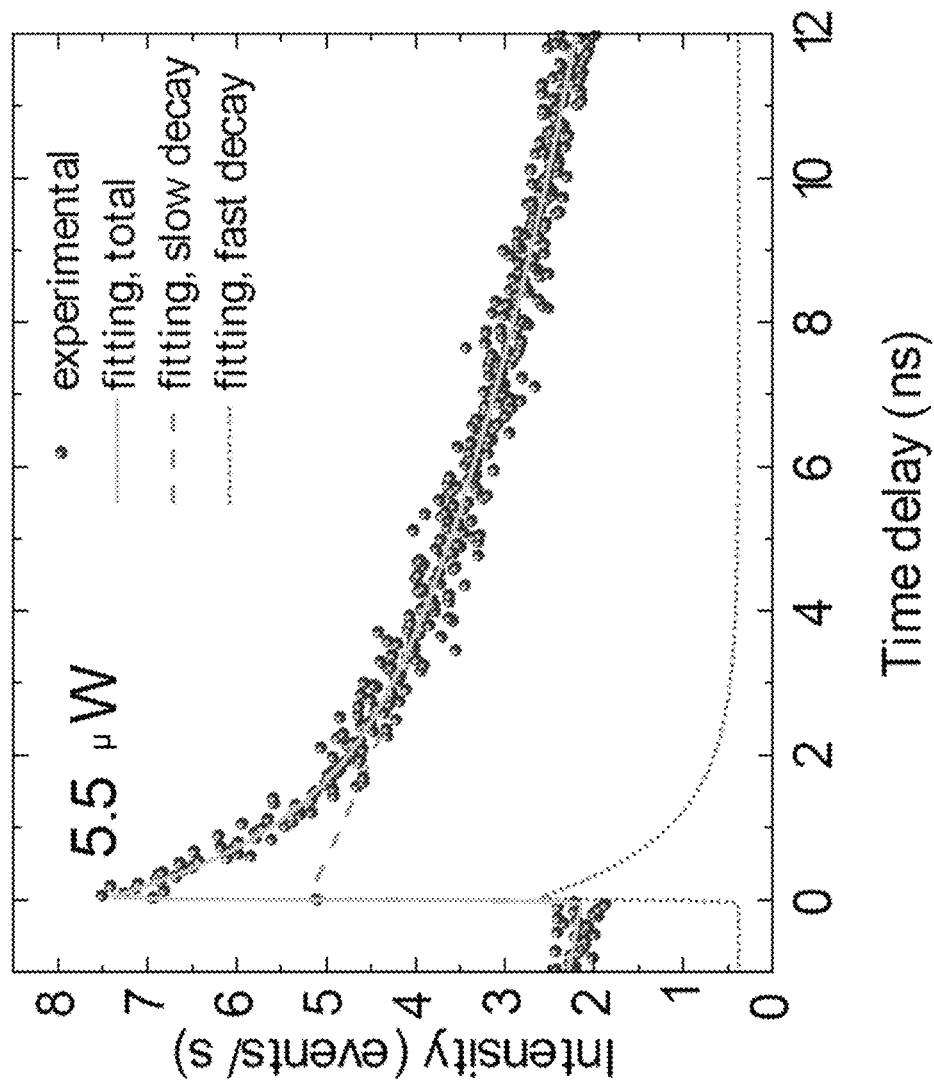
FIG. 5F is a TRPL spectra of localized emission using femtosecond excitation at 540 nm and 5.5 µm, in accordance with embodiments of the present disclosure. Free (fast decay, dotted line) and bound (slow decay, dashed line) represent exciton contributions to a measured event count.

Both free exciton emission having a faster timescale and scaling0 linearly with power, and bound exciton emission having a slower decay time and saturation behavior, are seen in FIGS. 5A through 5F, where the fast component showed a linear power dependence, whereas the slow component showed saturation at comparable powers. FIG. 5A is a TRPL spectra of localized emission using femtosecond excitation at 540 nm and 0.20 μm. Free (fast decay, dotted line) and bound (slow decay, dashed line) represent exciton contributions to a measured event count. FIG. 5B is a TRPL spectra of localized emission using femtosecond excitation at 540 nm and 0.31 μm. Free (fast decay, dotted line) and bound (slow decay, dashed line) represent exciton contributions to a measured event count. FIG. 5C is a TRPL spectra of localized emission using femtosecond excitation at 540 nm and 0.65 μm. Free (fast decay, dotted line) and bound (slow decay, dashed line) represent exciton contributions to a measured event count. FIG. 5D is a TRPL spectra of localized emission using femtosecond excitation at 540 nm and 1.1 μm. Free (fast decay, dotted line) and bound (slow decay, dashed line) represent exciton contributions to a measured event count. FIG. 5E is a TRPL spectra of localized emission using femtosecond excitation at 540 nm and 4.4 μm. Free (fast decay, dotted line) and bound (slow decay, dashed line) represent exciton contributions to a measured event count. FIG. 5F is a TRPL spectra of localized emission using femtosecond excitation at 540 nm and 5.5 μm. Free (fast decay, dotted line) and bound (slow decay, dashed line) represent exciton contributions to a measured event count.

The observations of FIGS. 5A-5F indicated that both free and bound excitons were present in the correlation experiment. This can be seen from the logarithmic intensity plot shown in FIG. 6A. The $g^{(2)}(0)$ value may possibly be improved with resonant excitation. Instead of exciting far above the band gap, which creates a large free exciton population, resonant excitation could be used to excite only the localized emitter. This would lead to reduced free exciton background and is a common technique to improve the single photon emission fidelity. Additionally, identifying emitters with energies farther away from the broad free exciton emission peak, or finding emitters with brighter emission relative to the free exciton emission, would also improve the single photon emission fidelity.

Figure 6A:
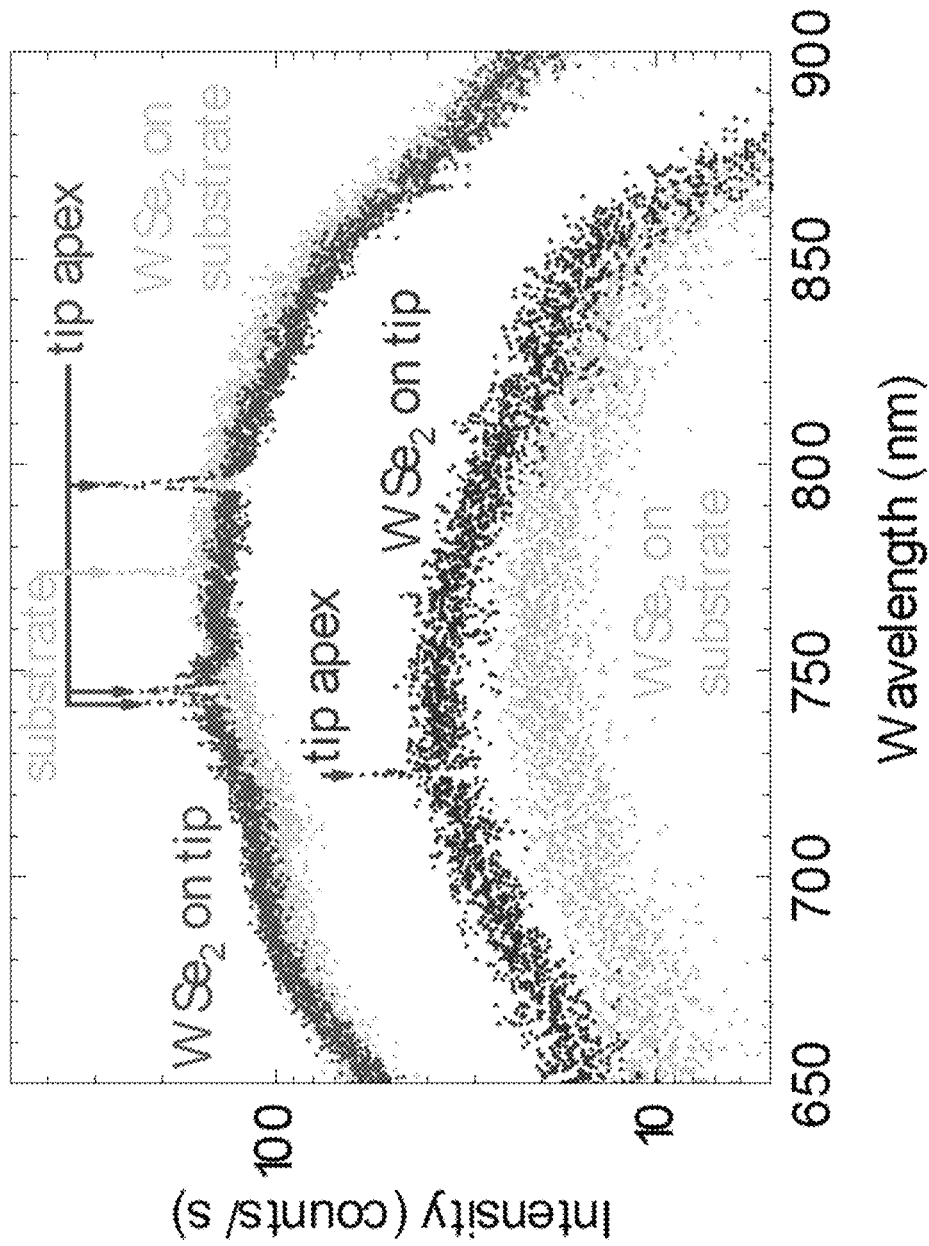
FIG. 6A is a wide spectral window photoluminescence (PL) of $WSe_2$ at an apex of a $SiO_2$ tip, in accordance with embodiments of the present disclosure. Compared with that of nearby material on a planar substrate, a blue shift is shown in the free exciton emission peak wavelength of $\Delta\lambda_{peak}$=22.1±3.4 nm (47.3±8.3 eV) and localized emission peaks.

FIGS. 4A through 5F give the spectroscopic characterization results of optical emission arising from epitaxial $WSe_2$ on the apex of a $SiO_2$ tip. Additional comparison of the emission spectra from the unstrained epitaxial $WSe_2$, and from the strained epitaxial $WSe_2$ at the tip apex, along with representative PL from non-quenching tip emitters is given in FIGS. 6A through 7C. FIG. 6A is a comparison of wide spectral window PL spectra of $WSe_2$ at the apex of a $SiO_2$ tip with $WSe_2$ on a planar surface. As shown in FIG. 6A, the free exciton emission at the tip apex exhibits a blue shift of 22.1±3.4 nm (47.3±8.3 meV) compared to the unstrained free exciton emission peaks. This is 1.2 to 8.5 times larger than observed for tent-pole-based studies.

Figure 6B:
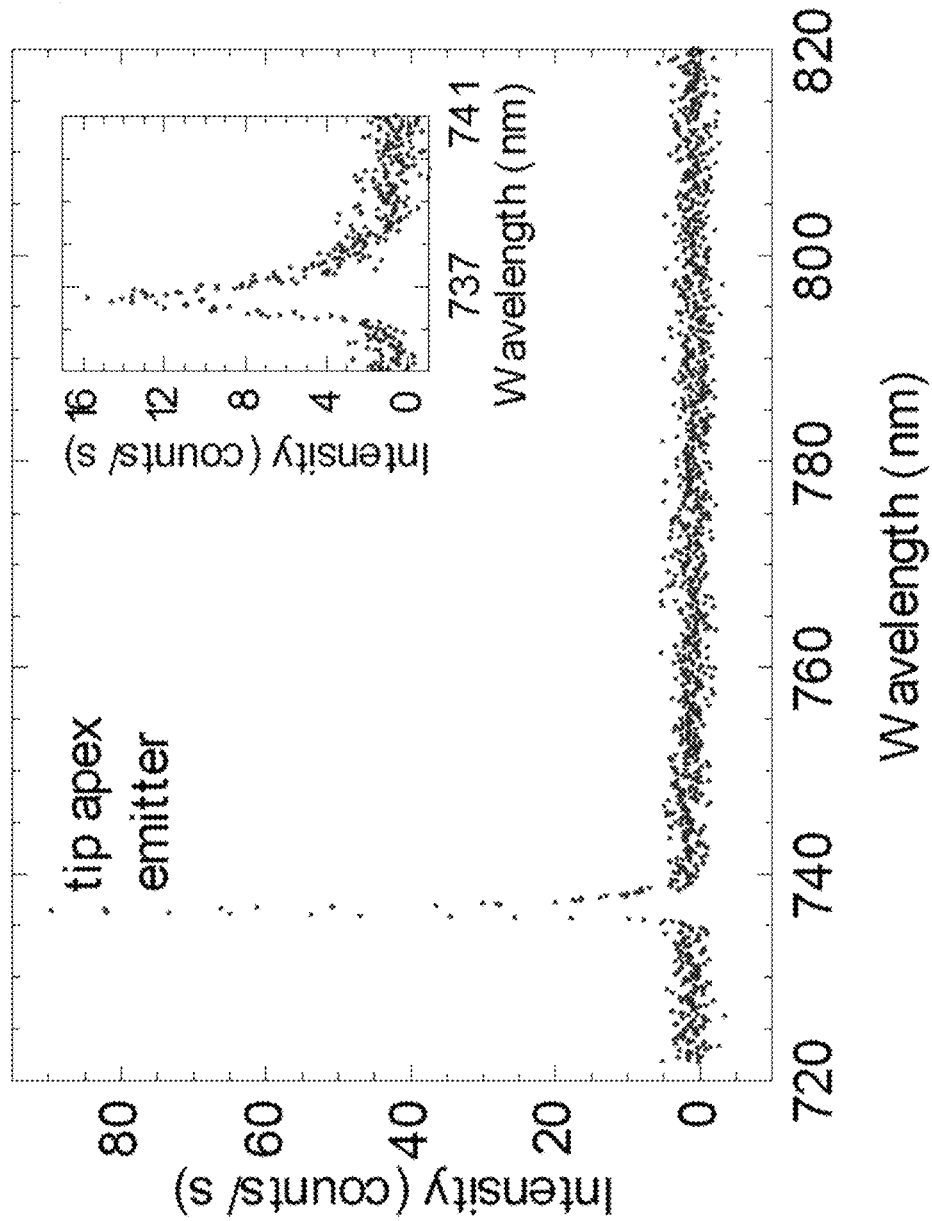
FIG. 6B is a representative PL plot of an emitter obtained at the center of a $SiO_2$ tip, in accordance with embodiments of the present disclosure.
Figure 6C:
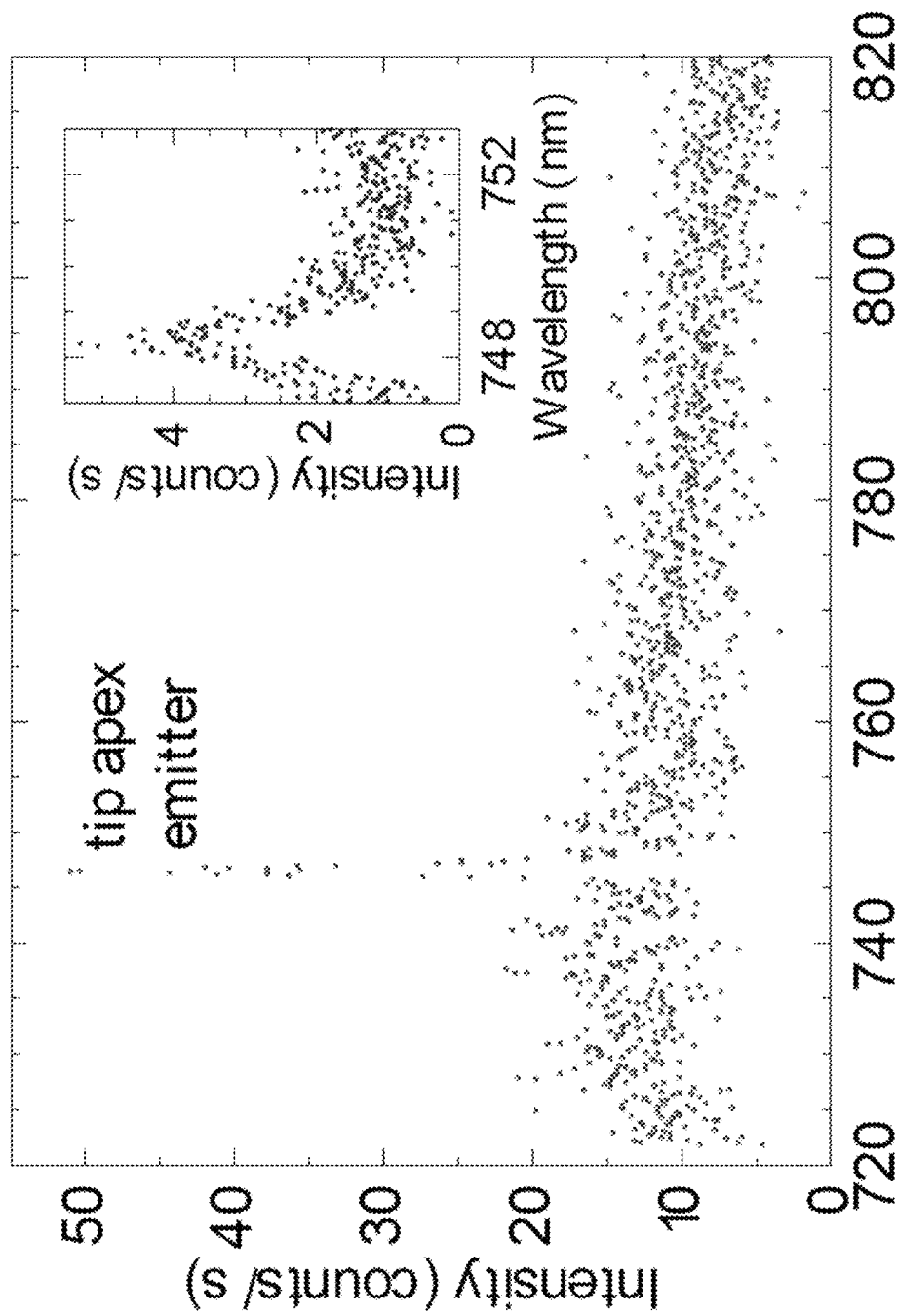
FIG. 6C is a representative PL plot of an emitter obtained at the center of a $SiO_2$ tip, in accordance with embodiments of the present disclosure.
Figure 6D:
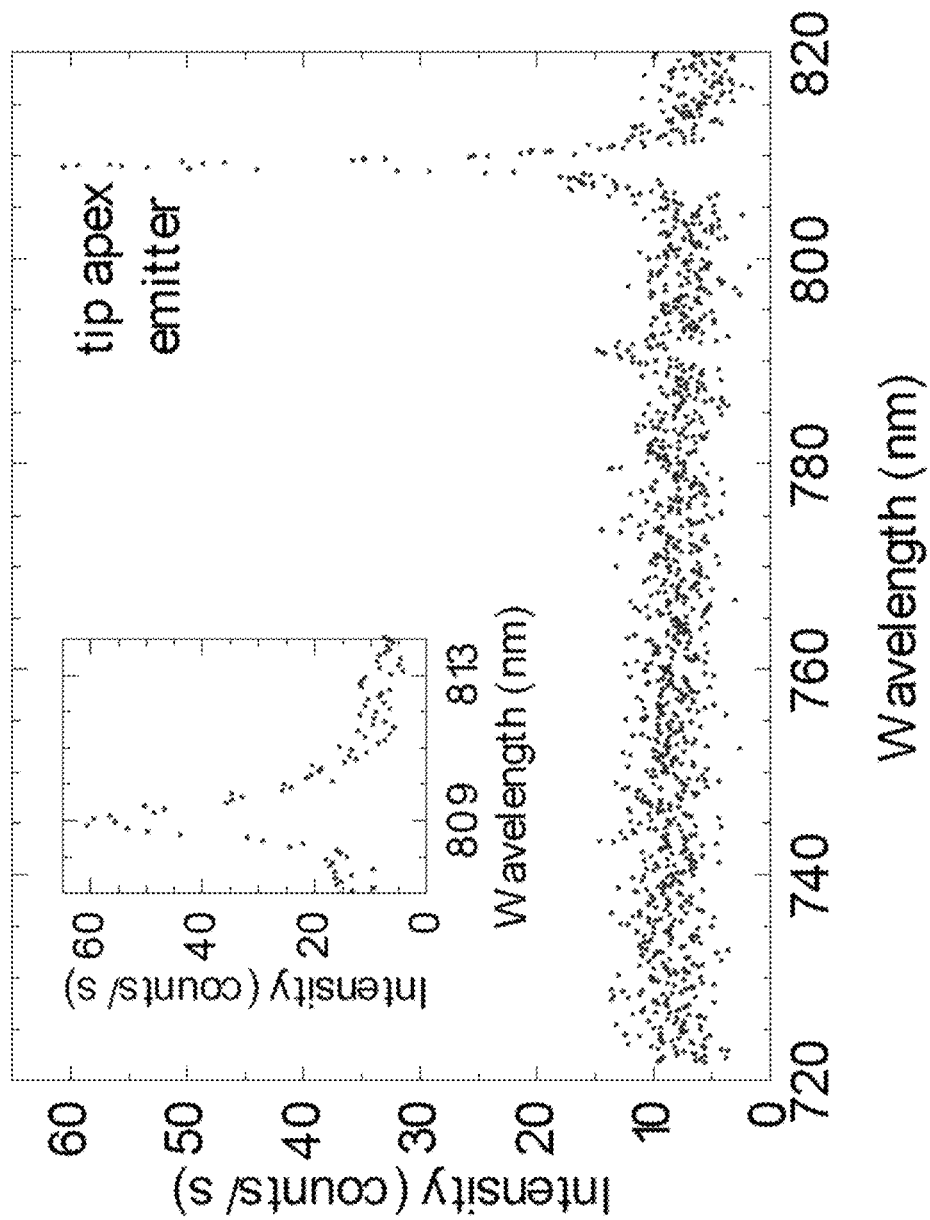
FIG. 6D is a representative PL plot of an emitter obtained at the center of a $SiO_2$ tip, in accordance with embodiments of the present disclosure.
Figure 6E:
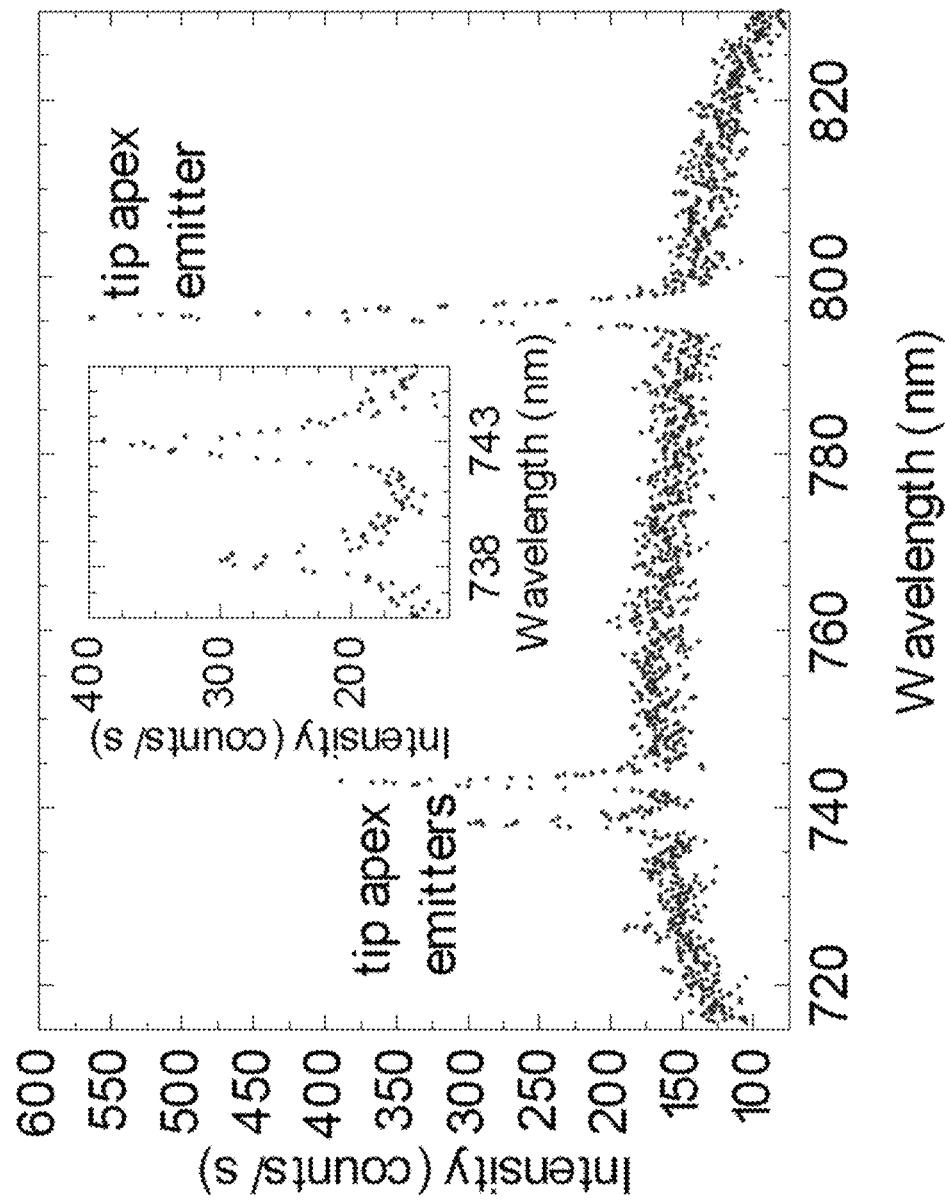
FIG. 6E is a representative PL plot of an emitter obtained at the center of a $SiO_2$ tip, in accordance with embodiments of the present disclosure.
Figure 6F:
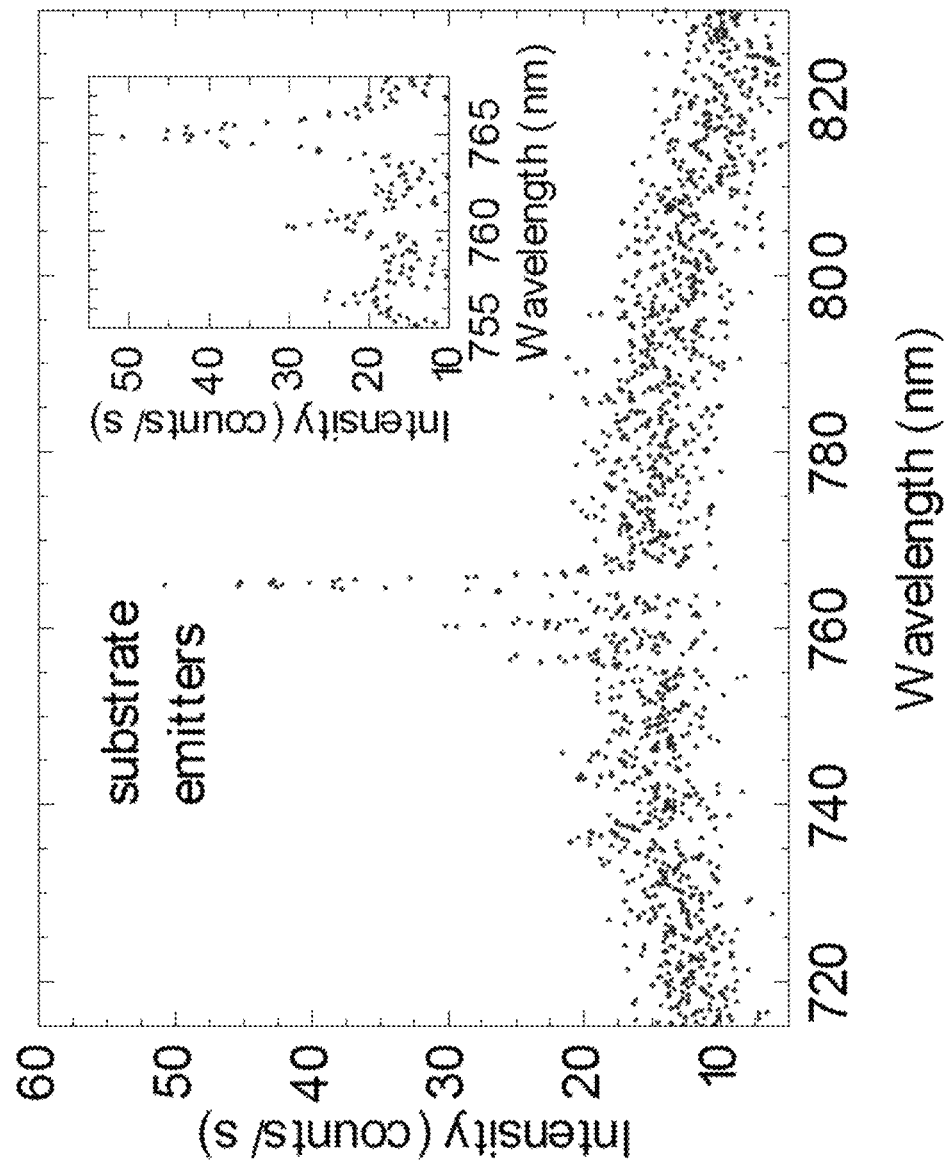
FIG. 6F is a representative PL plot of an emitter obtained on a planar substrate, in accordance with embodiments of the present disclosure.
Figure 7A:
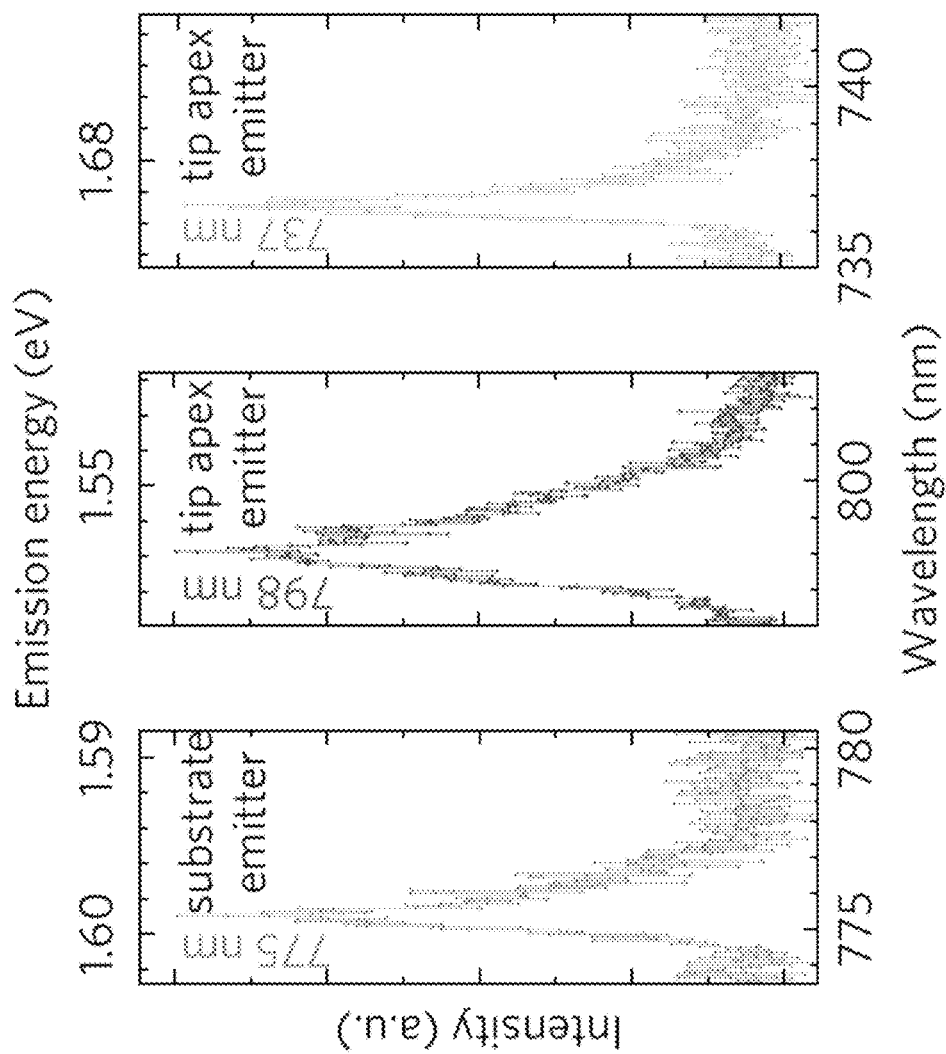
FIG. 7A are high resolution pulsed excitation PL plots of defect emission in $WSe_2$ occurring intrinsically in material (left) and at the apex of $SiO_2$ tips (middle, right), in accordance with embodiments of the present disclosure.
Figure 7B:
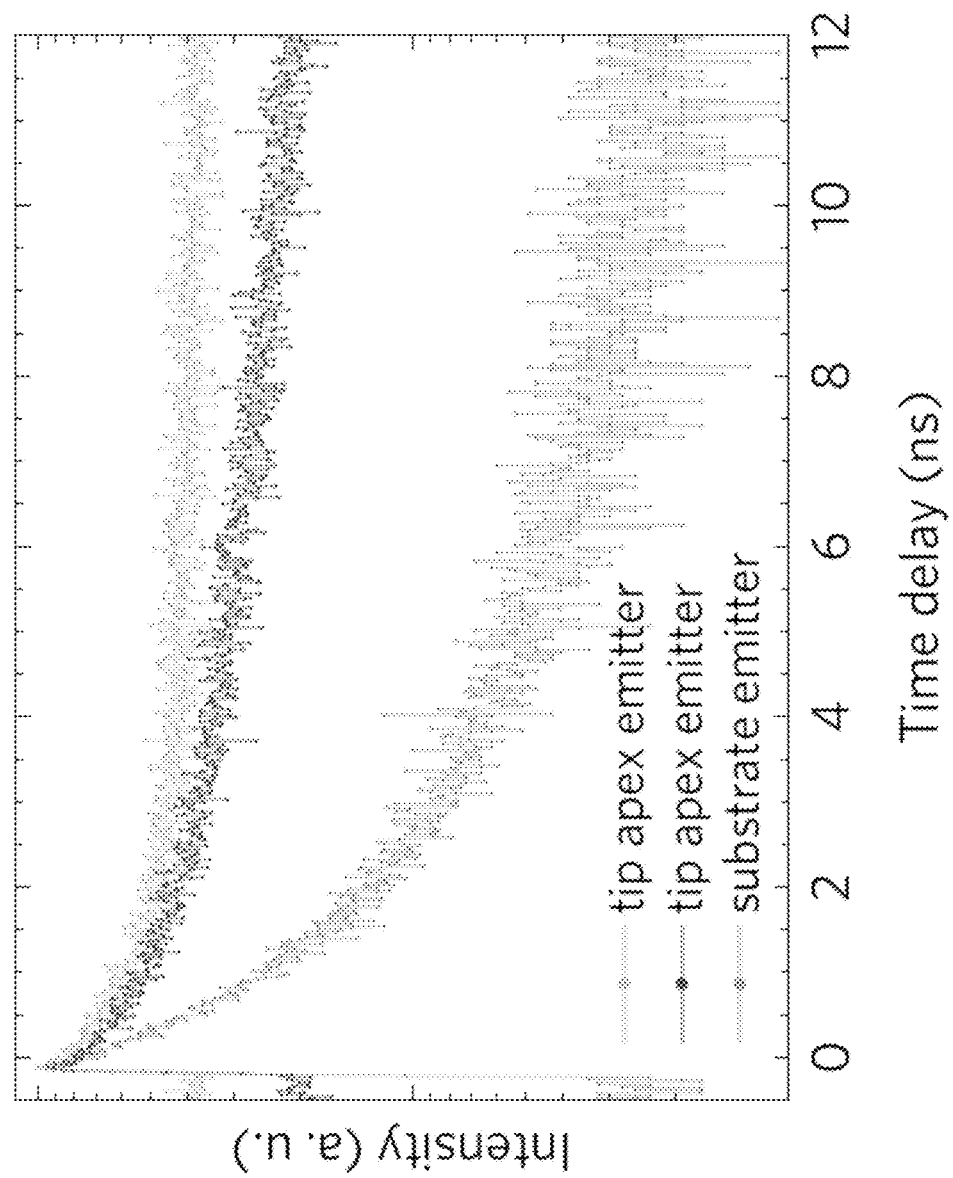
FIG. 7B is a TRPL spectra of intrinsic (bottom plot corresponding to the left panel in FIG. 7A) and strain-engineered emitters (middle plot corresponding to the center panel in FIG. 7A, top plot corresponding to right panel in FIG. 7A), in accordance with embodiments of the present disclosure.
Figure 7C:
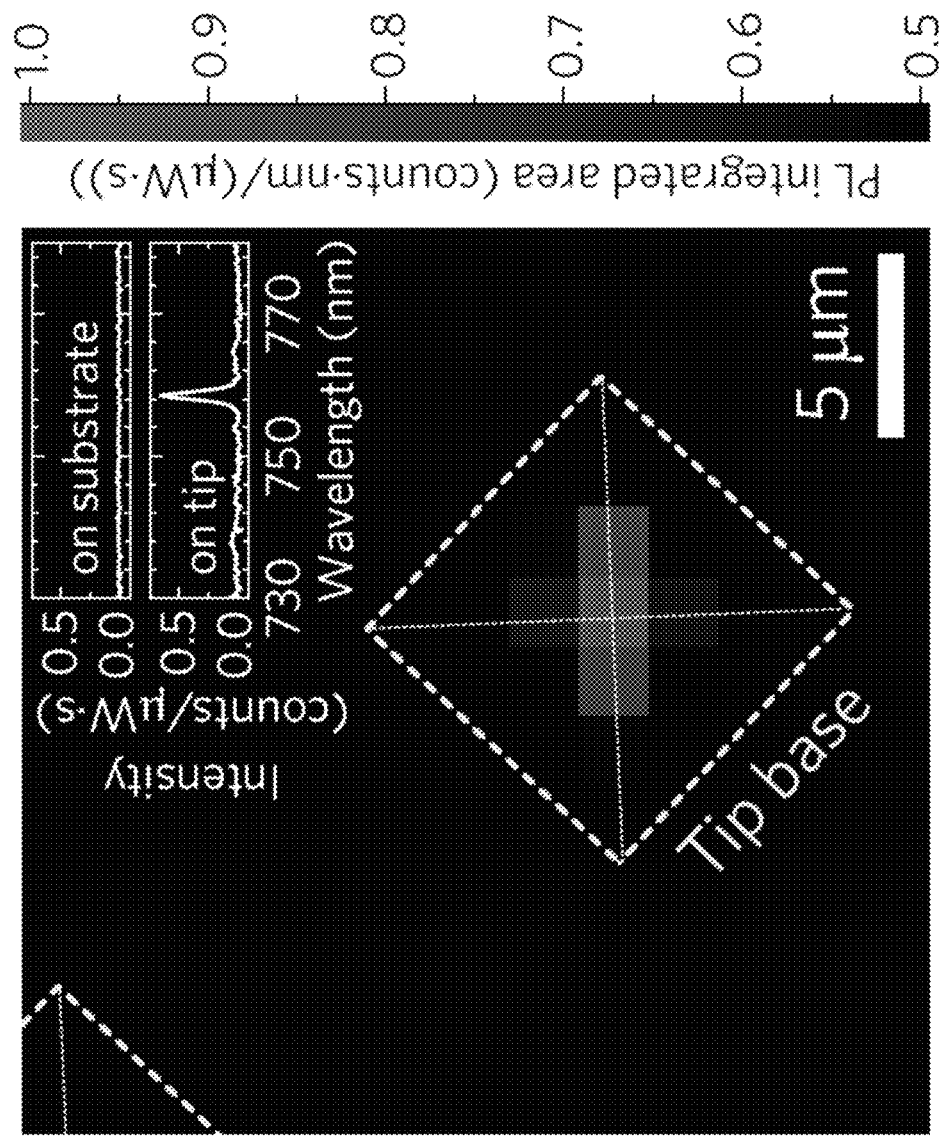
FIG. 7C is a scanning continuous-wave excitation PL plot of epitaxial $WSe_2$ transferred onto a $SiO_2$ tip, in accordance with embodiments of the present disclosure. The integrated area of the localized exciton peak is shown versus x-y coordinate.

FIG. 6B is a representative PL plot of an emitter obtained at the center of a $SiO_2$ tip. FIG. 6C is a representative PL plot of an emitter obtained at the center of a $SiO_2$ tip. FIG. 6D is a representative PL plot of an emitter obtained at the center of a $SiO_2$ tip. FIG. 6E is a representative PL plot of an emitter obtained at the center of a $SiO_2$ tip. FIG. 6F is a representative PL plot of an emitter obtained on a planar substrate. FIG. 7A are high resolution pulsed excitation PL plots of defect emission in $WSe_2$ occurring intrinsically in material (left) and at the apex of $SiO_2$ tips (middle, right). FIG. 7B is a TRPL spectra of intrinsic (bottom plot corresponding to the left panel in FIG. 7A) and strain-engineered emitters (middle plot corresponding to the center panel in FIG. 7A, top plot corresponding to right panel in FIG. 7A). FIG. 7C is a scanning continuous-wave excitation PL plot of epitaxial $WSe_2$ transferred onto a $SiO_2$ tip. The integrated area of the localized exciton peak is shown versus x-y coordinate.

Since the elastic deformation is tensile at the upper $WSe_2$ surface and compressive at the lower surface, quantitative deconvolution of the strain-dependent emission spectra is not trivial.

The herein disclosed gas source CVD created $WSe_2$ films contain grains smaller than the 0.7 μm to 1 μm excitation beam diameter. As the TRPL intensity $I(\Delta t)$ at any defect emission wavelength contains contributions from both free and localized (bound) excitons, a bi-exponential rise and decay model may be used to gain insight into the lifetimes of bound and free excitons. Such modeling may be represented as:

$$I(\Delta t) - I_{bkgd} = \sum\nolimits_{j=fast,slow} \sum\nolimits_{i=-\infty}^{\infty} \qquad \text{Equation 3}$$
$$I_{0,j}[(e^{+(\Delta t-iT)/\tau_{rise,j}})^{-1} + (e^{-(\Delta t-iT)/\tau_{decay,j}})^{-1}]^{-1},$$

where $I_{bkgd}$ is the background count rate, the subscript j indicates the fast and slow processes attributed to free and localized excitons respectively, the subscript i is the peak index, $I_{0,j}$ is the exciton emission intensity, $\Delta t$ is the time delay, T is the period, and $\tau_{rise,j}$ and $\tau_{decay,j}$ are the characteristic lifetimes of excitonic rise and decay respectively. To minimize the number of adjustable parameters used in Equation 3, all TRPL data was fit with a fully unconstrained model to obtain T=12.4415±0.0008 ns and $\tau_{rise,fast}$=$\tau_{rise,slow}$=7.95±0.71 μs. As the obtained period uncertainty and rise time were well below the detection limit of the silicon avalanche photodiode used in the time resolved measurements, physical significance is not ascribed to these quantities; only to state that T and $\tau_{rise}$ are sufficiently consistent between measurements as to hold these parameters fixed at the listed values during data analysis. Subsequently, Equation 3 was constrained to allow only $I_{0,j}$ and $\tau_{decay,j}$ as adjustable parameters. $I_{bkgd}$ was dark count limited at about 80 counts·s$^{-1}$ to about 100 counts·s$^{-1}$, which was more than 50 times below the TRPL count rate. Subsequently, Equation 3 was constrained to allow only fast and slow components of $I_{0,j}$ and $\tau_{decay,j}$ as adjustable parameters.

Power dependence of the emission $I_{0,j}$ can be fit using a saturation model, which may be represented as:

$$I_{0,j}(P) = I_{0,j}(P = \infty) \frac{P}{P + P_{half-sat,j}}, \qquad \text{Equation 4}$$

where P is the excitation power, $I_{0,j}(P=\infty)$ is the saturation intensity, $P_{half-sat}$ is the half-saturation power, and j=fast, slow relaxation processes. FIG. 4B demonstrates that excitation power dependencies of the deconvolved emission intensities exhibit (i) a nearly linear trend for the delocalized transition (free exciton) with $I_{\infty,fast}$=16.4±20.0 events·s$^{-1}$ and $P_{half-sat,fast}$=32.1±44.9 μW (large uncertainty is indicative of linear dependence on the excitation power) and (ii) emitters located on the top of the tips of the present disclosure (bound exciton) exhibit saturation behavior with $I_{\infty,slow}$=5.89±0.71 events·s$^{-1}$ and $P_{half-sat,slow}$=5.36±1.16 μW. Although the emission intensity for the localized emitter is not fully saturated at the maximum power used herein, it was observed that, at higher powers, defect emission from the tips can spontaneously quench. Hence, excitation was limited herein to the low power regime.

FIG. 4C demonstrates quantum emission of a defect emission site at the apex of a $SiO_2$ tip at about 3.8K through time-dependent photon field intensity correlation, $g^{(2)}(\Delta t)$. The data may be modeled using a single exponential decay (two level) photon anti-bunching model, which may be represented as:

$$g^{(2)}(\Delta t) = 1 - [1 - g^{(2)}(\Delta t=0)] \cdot e^{-|\Delta t|/\tau_{decay}}, \qquad \text{Equation 5}$$

where $\Delta t$ is the time delay, $\tau_{decay}$ is the lifetime, $g^{(2)}(\Delta t=0)$ is the second order photon correlation parameter for single photon emission, and $[1-g^{(2)}(\Delta t=0)]$ is defined as the single photon purity. A high degree of photon antibunching was obtained, $g^{(2)}(\Delta t=0)<0.3$, over a collection time of 45 min, and exhibited stable emission up to 8 hours. The $g^{(2)}$ spectra is normalized at far from zero (240.32 ns≤Δt≤2097.44 ns). Stability in emission intensity allowed for the obtainment of the intrinsic $g^{(2)}(\Delta t=0)$=0.284±0.062 and an intrinsic $\tau_{decay}$=9.01±1.56 ns from collections over three different times from 45 min to 8 h. Although the obtained $\tau_{decay}$ is in agreement with that obtained by TRPL, HBT measurements of lifetime are heavily influenced by the excitation power used in the measurement, making TRPL an appropriate technique for lifetime determination.

By comparing TRPL of $WSe_2$ defect emission on $SiO_2$ tips with a $WSe_2$ defect on a substrate, the intrinsic defects in the material were able to be decoupled from defects arising through engineered morphology, which may elucidate the characteristics of strain-induced emission (see FIGS. 6A through 7B). In comparison with engineered emitters where $I_{0,slow} > I_{0,fast}$, the intrinsic localized emission site located on the substrate exhibited a slow-component emission intensity 2.9 times lower than that of the fast component, indicating dominance of the PL by the free exciton for this intrinsic defect. TRPL also revealed that the decay time for localized excitons at the apex of three representative tips was 12.75, 19.47, and 68 times longer than for the free exciton, with $\tau_{decay,slow}$=11.203±0.660 ns, 15.58±0.50 ns, and 56.40±7.71 ns and $\tau_{decay,fast}$=0.800±0.040 ns, 0.828±0.059 ns, and 0.879±0.047 ns for the emitters shown in FIGS. 4A and 7B. This is in comparison to the case for localized defect emission from $WSe_2$ on the substrate for which $\tau_{decay,slow}$ (2.36±0.24 ns) was only 4.8 times longer than $\tau_{decay,fast}$ (0.516±0.029 ns). The slower relaxation times for both the free and localized excitons on the tips may also be due to phonon-mediated dark state recombination or changes in density of states and optical phonon energies—where phonon softening may proportionately increase the lifetime.

The time window used in the herein disclosed experiment was on the order of 12.5 ns for TRPL, which was limited by the repetition rate of the laser. This explains why the longest decay time possessed a large error and is thus more qualitative in nature.

In an attempt to more accurately quantify defects intrinsically present in epitaxial $WSe_2$ films of the present disclosure, Rutherford backscattering spectrometry (RBS) was conducted. The RBS was conducted on a National Electrostatics Corporation 3 MV Tandem Accelerator using a 2 MeV $^4He^+$ ion beam. A solid-state silicon detector located at 167° from the beam direction was used to detect the scattered He particles.

Figure 8:
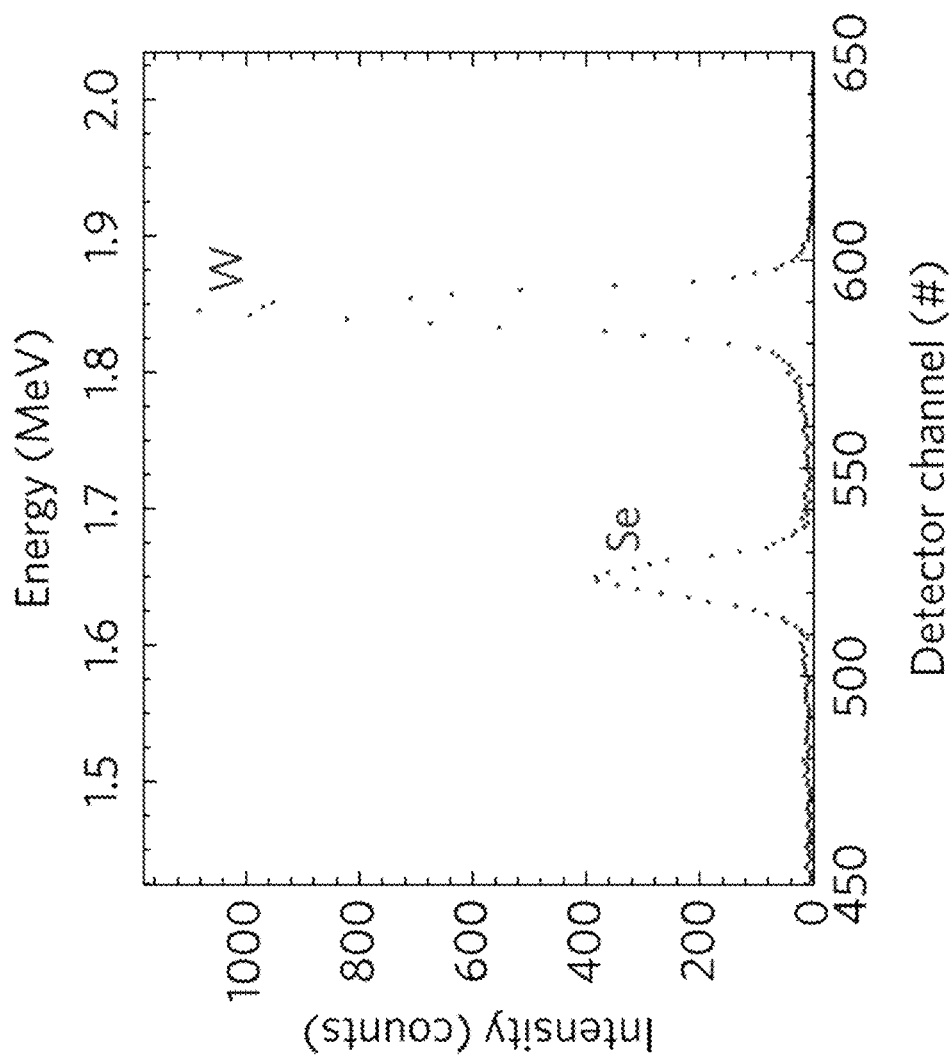
FIG. 8 is a Rutherford backscattering spectrometry (RBS) spectrum of epitaxial $WSe_2$, in accordance with embodiments of the present disclosure.

RBS analysis (FIG. 8) allowed for the obtainment of the elemental atomic ratios of epitaxial $WSe_2$ films disclosed herein. Analyzing the scattering yield ratios between W and Se, a W:Se ratio of 1:1.91±0.04, corresponding to a selenium deficiency of about 9%, was obtained. This is considerably higher than the about 2.2% selenium deficiency obtained for crystallites synthesized through powder vaporization, which may lead to the variation in relaxation times described herein. Confocal photoluminescence mapping around a tip is shown in FIG. 7C, and indicates defect emission originates at the tip center.

Figure 9A:
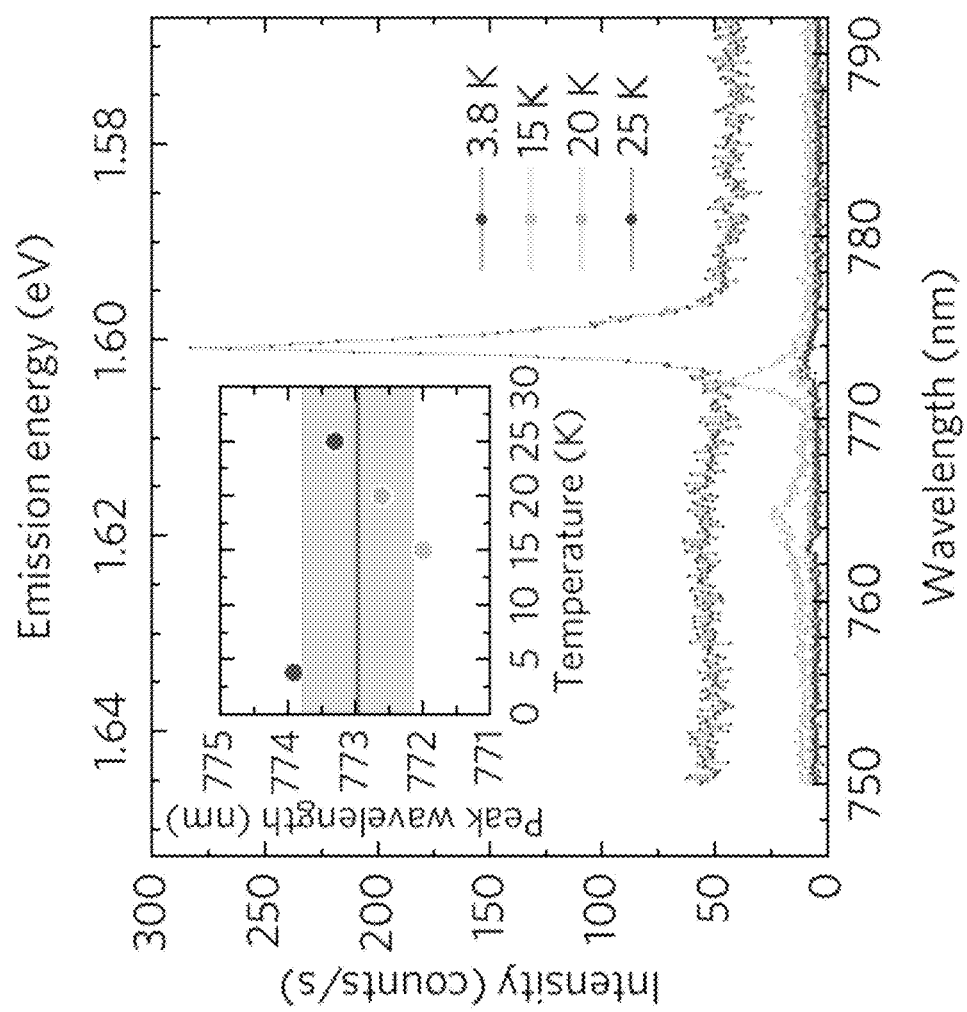
FIG. 9A is a pulsed excitation PL spectra of localized emission from $WSe_2$ on a $SiO_2$ tip as a function of temperature, in accordance with embodiments of the present disclosure. The inset illustrates peak emission wavelength over the measured temperature range exhibits a mean of 772.95 nm and a standard deviation of 0.83 nm.
Figure 9B:
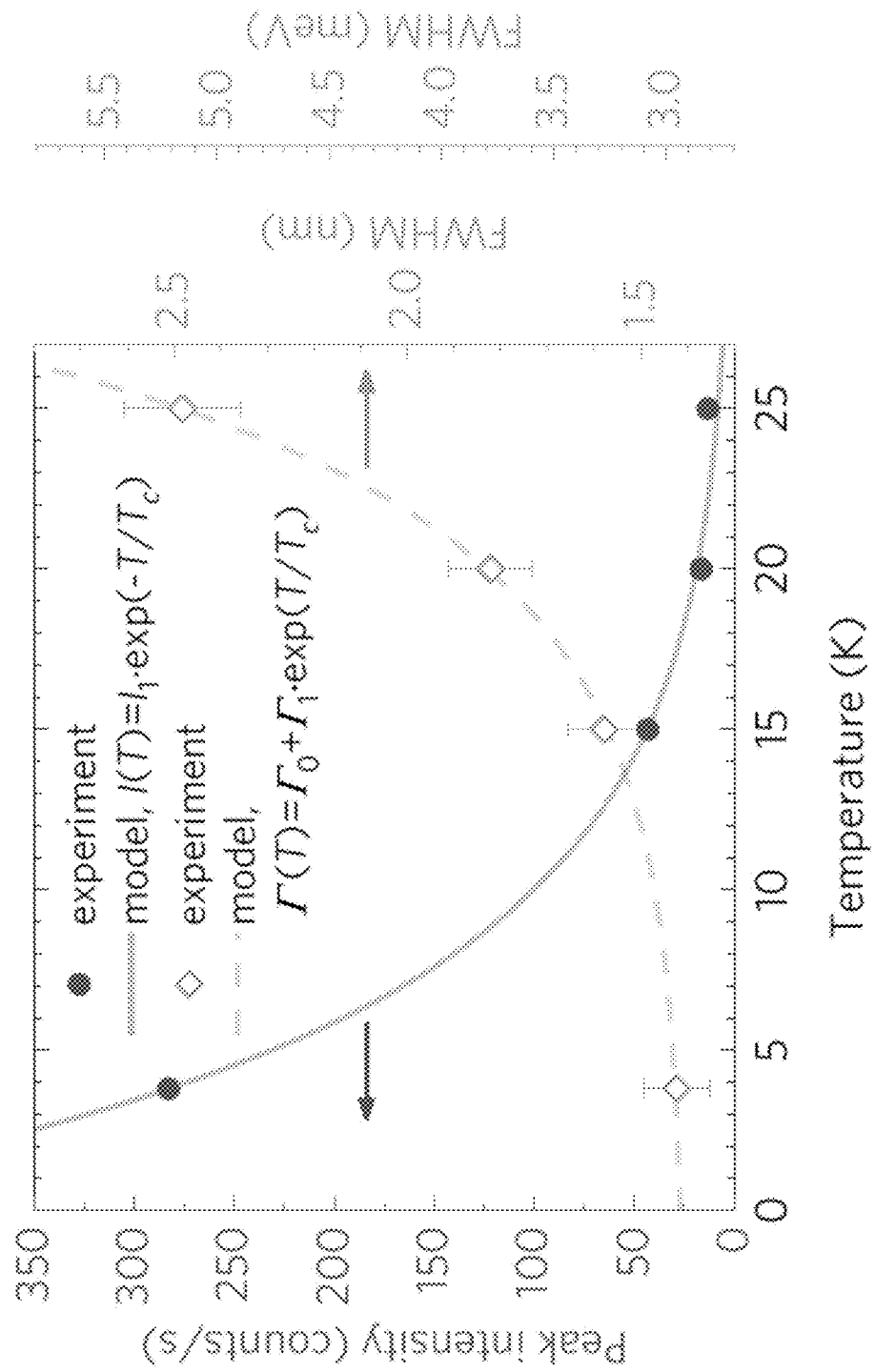
FIG. 9B illustrates peak emission intensity, I, and full width at half maximum (FWHM), Γ, versus temperature of a localized emitter, in accordance with embodiments of the present disclosure. I and Γ can be modeled by exponential decay and growth models, respectively.
Figure 10A:
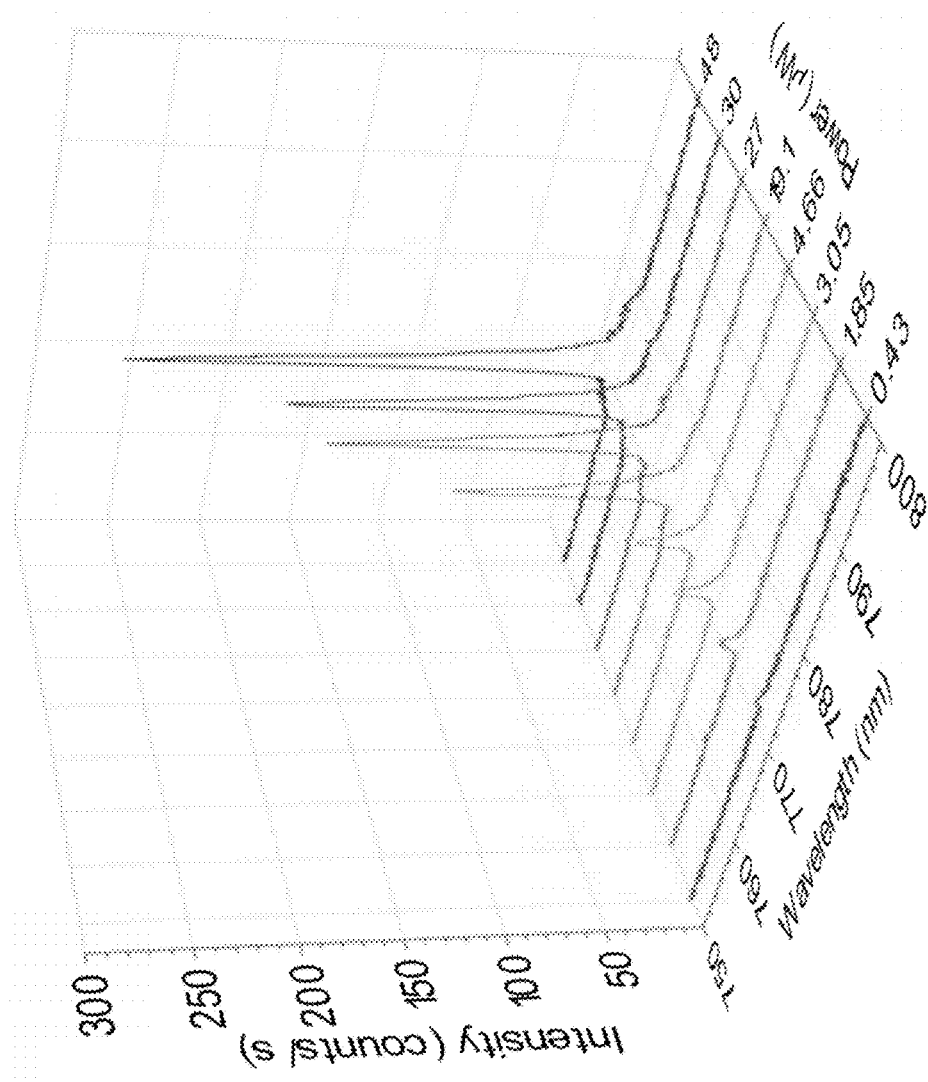
FIG. 10A is a PL spectra of localized emission with tunable long-pass and short-pass filters in place, in accordance with embodiments of the present disclosure.
Figure 10B:
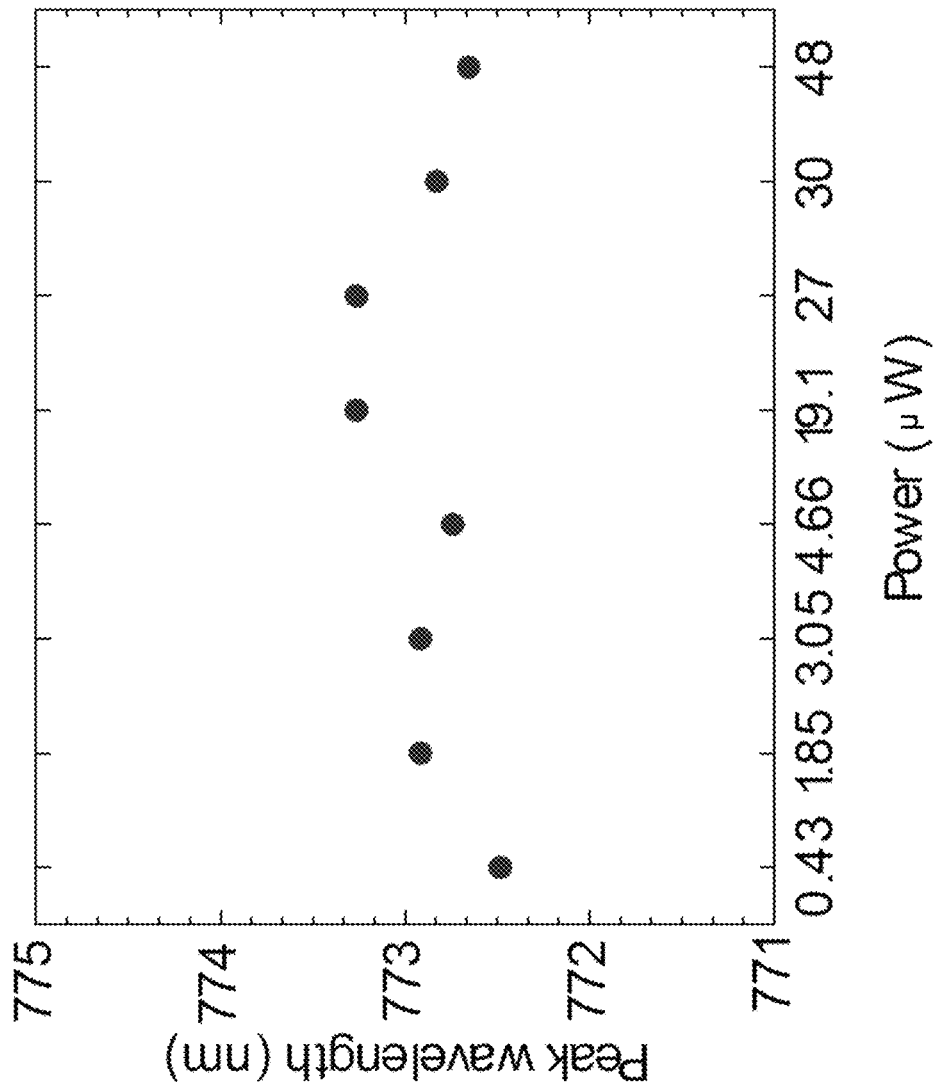
FIG. 10B illustrates peak emission wavelength is relatively constant over a measured excitation power range with a mean of 772.88 nm and a standard deviation of 0.27 nm, in accordance with embodiments of the present disclosure.

FIGS. 9A and 9B give the temperature dependent emission spectra of a localized defect emission site. Over the temperature range of 3.8 K to 25 K, the emission energy remained relatively constant with a mean and standard deviation of 772.953 nm (1.604 eV) and 0.830 nm (0.00172 eV), respectively. This is in agreement with the power dependent peak emission wavelength observed, 772.88±0.27 nm (1.604±0.001 eV) as shown in FIGS. 10A and 10B, and the spectral wandering demonstrated in literature. Similar to literature, localized emission is not observable at temperatures above 25 K. FIG. 10B shows that the temperature dependent emission intensity diminishes exponentially and can be modeled as $I(T)=I_1 \cdot \exp[-T/T_e]$, with a characteristic temperature of $T_e$=5.98±0.24 K (corresponding to a $k_B T$ energy of 515 µeV, where $k_B$ is the Boltzmann constant). This is in agreement with the value obtained for quantum emission from monolayer $WSe_2$ (about 300 µeV). Additionally, the full width at half maximum increased exponentially from 1.42 nm (2.94 meV) at 3.8 K to 2.48 nm (5.15 meV) at 25 K, and can be modeled as $I(T)=\Gamma_0+\Gamma_1 \cdot \exp[-T/T_e]$, with a characteristic temperature of $T_e$=5.4±0.3 K and $\Gamma_0$=1.41±0.01 nm (2.91±0.03 meV). Increasing the defect trapping energy so that room temperature operation can be demonstrated may require the use of chemical-functionalization or solitary dopants.

Figure 11:
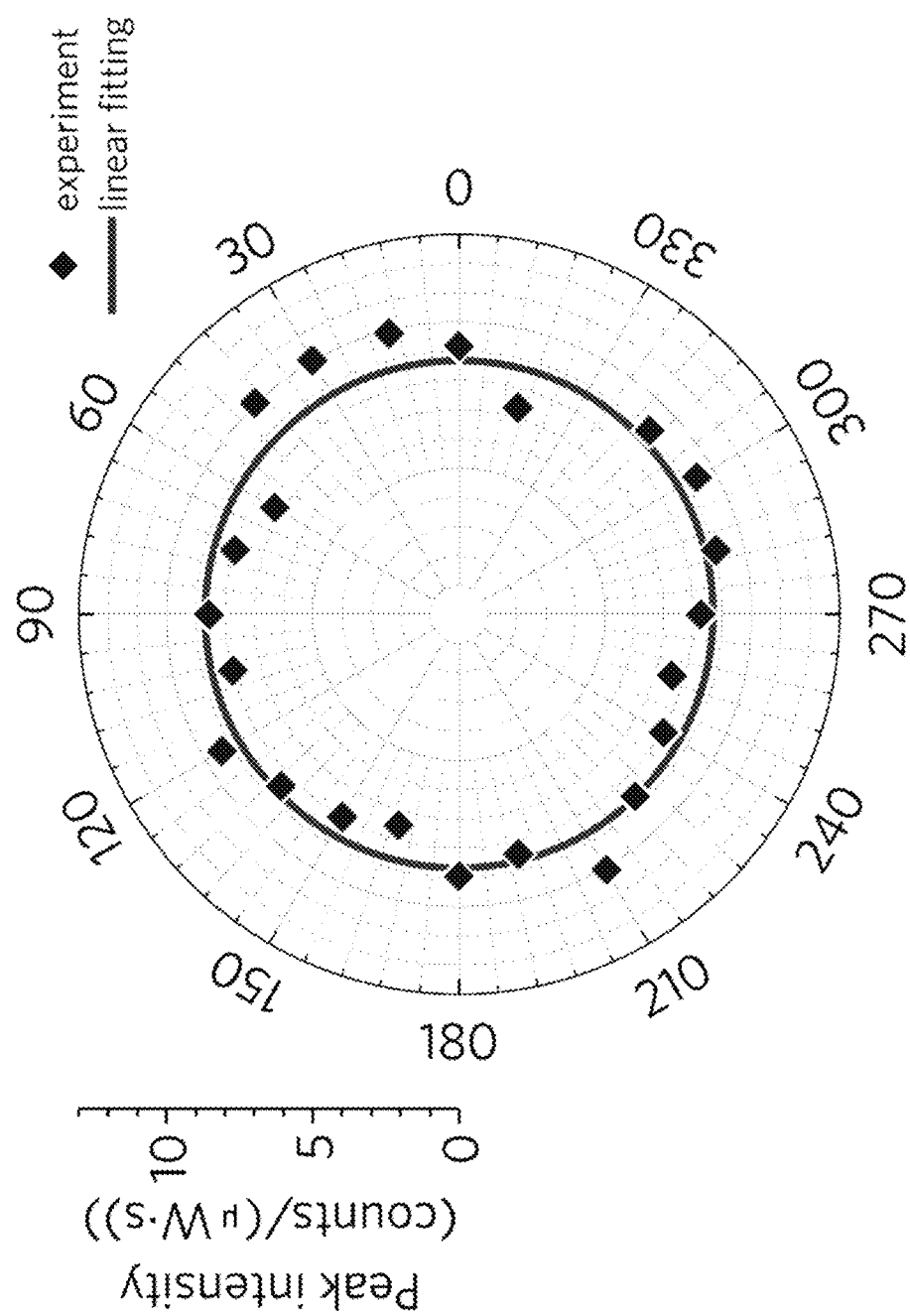
FIG. 11 illustrates how polarization dependence of localized peak emission intensity (squares) demonstrates no preferential orientation of emitted photons, which can be fit as 8.68±0.18 counts·$s^{-1}$ $\mu W^{-1}$ (line), in accordance with embodiments of the present disclosure.

Literature relating to defect emission in 2D materials has observed about 55 µeV to 900 µeV fine structure splitting and polarization in the photoluminescence, both of which indicate quantum emission may arise from a dipole-containing defect structure or anisotropic strain such as observed in quantum dots. Within the resolution of the experimental instrumentation described herein, about 0.05 nm (0.2 meV), fine-structure splitting in the PL spectra of the engineered localized defects was not observed even at about 3.8 K, although splitting could be hidden by the mechanisms leading to the observed broadened peaks. Additionally, the emission was random-unpolarized when excited with linearly polarized light with a polarizer placed in the collection beam path (see FIG. 11). If the emission site was actually localized because of a symmetric strain potential, then there would be no preferred polarization to the emitter, as observed herein. This is unlike the case of an intrinsic defect localization, where the defect is likely to have some trap potential asymmetries. In comparison to the present disclosure, the pillars used in the literature are quite wide (150 nm to 280 nm diameter) with observable asymmetry, which may explain why those works observe fine structure splitting.

Overview of Terms and Abbreviations

The following explanations of terms are provided to better describe the present disclosure and to guide those of ordinary skill in the art in the practice of the present disclosure. As used herein, "comprising" means "including" and the singular forms "a" or "an" or "the" include plural references unless the context clearly dictates otherwise. The term "or" refers to a single element of stated alternative elements or a combination of two or more elements, unless the context clearly indicates otherwise.

Unless explained otherwise, all technical and scientific terms used herein have the same meaning as commonly understood to one of ordinary skill in the art to which this disclosure belongs. Although methods and materials similar or equivalent to those described herein can be used in the practice or testing of the present disclosure, suitable methods and materials are described below. The materials, methods, and examples are illustrative only and not intended to be limiting, unless otherwise indicated. Other features of the disclosure are apparent from the following detailed description and the claims.

Unless otherwise indicated, all numbers expressing quantities of components, molecular weights, percentages, temperatures, times, and so forth, as used in the specification or claims, are to be understood as being modified by the term "about." Accordingly, unless otherwise indicated, implicitly or explicitly, the numerical parameters set forth are approximations that can depend on the desired properties sought and/or limits of detection under standard test conditions/methods.

While the present disclosure has been particularly described in conjunction with specific examples, it is evident that many alternatives, modifications, and variations will be apparent to those skilled in the art in light of the foregoing description. It is therefore contemplated that the appended claims will embrace any such alternatives, modifications, and variations as falling within the true spirit and scope of the present disclosure.

What is claimed is:

1. A method for modifying an indirect band gap two-dimensional (2D) film so that it is capable of single photon emission, comprising:
    synthesizing a 2D film epitaxially by metal organic chemical vapor deposition from tungsten hexacarbonyl ($W(CO)_6$) and hydrogen selenide ($H_2Se$) precursors at a partial pressure ratio of $W(CO)_6$:$H_2Se$·26000:1 onto an $Al_2O_3$ (sapphire) substrate heated to approximately 800° C.;
    providing the 2D film comprising at least one indirect band gap material, the 2D film having between 1 and 15 layers, wherein the 2D film comprises tungsten diselenide ($WSe_2$) with a thickness between 1.2979 nm and 10.3829 nm;
    applying the 2D film to a substrate, wherein the 2D film protects a portion of the substrate that it covers and leaves another portion of the substrate uncovered and exposed, wherein the substrate comprised of a 500 μm-thick Si (silicon) wafer coated first with a 500 nm-thick $Si_3N_{4-x}$ (sub-stoichiometric silicon nitride) film deposited by low-pressure chemical vapor deposition from $H_2SiCl_2$ (dichlorosilane) and $NH_3$ (ammonia) precursors at a partial pressure ratio of $H_2SiCl_2$:$NH_3$~5:1 (flow rates of 80 cm$^3$ min$^{-1}$:16 cm$^3$ min$^{-1}$) at approximately 840.9° C. temperature and 150 mTorr pressure, and wherein the substrate first coat is followed by a second coating of a 10 μm-thick $SiO_2$ (silicon dioxide) film deposited by chemical vapor deposition using $SiH_4$ (silane) and $O_2$ (oxygen) at a partial pressure ratio of $SiH_4$:$O_2$~1:2 at 500° C. and wherein the substrate is annealed at 1000° C. in vacuum; and
    transferring the 2D film to a substrate comprising at least a first tip having a radius of less than 5 nm by chemically etching the another portion of the substrate that is uncovered by the 2D film, the transferring rendering the 2D film into a three-dimensional (3D) film capable of single photon emission.

2. The method of claim 1, further comprising:
    producing the substrate to have an array of tips each having a radius of about 4 nm; and
    transferring the 2D film to the substrate having the array of tips.

3. The method of claim 2, further comprising producing the substrate to have the array of tips with a distance of about 0.25 μm to about 100 μm between each adjacent tip.

4. The method of claim 1, wherein the substrate comprising a dielectric material.

5. The method of claim 4, wherein the substrate comprises silicon dioxide ($SiO_2$).

6. The method of claim 1, wherein transferring the 2D film to the substrate uses at least a first tip having a base dimension that is double a height dimension of the at least first tip.

7. The method of claim 1, further comprising, after transferring the 2D film, thermally annealing the 2D film and the substrate to produce a film/substrate construct comprising the 3D film.

8. A method for creating a three-dimensional (3D) film from an indirect band gap two-dimensional (2D) film for single photon emission, comprising:
    exposing a substrate to a volatile precursor in a chemical vapor deposition (CVD) process, wherein the volatile precursor comprises a metal, and wherein a higher concentration of chalcogen is used in comparison to nonmetallic precursor to form stoichiometric transition metal dichalcogenide (TMD) material, and wherein the CVD process incorporates contaminants on the substrate from methyl groups in the volatile precursor and further using $H_2Se$ as selenium precursor with Se:W ratio of approximately 26000:1 to form the indirect band gap 2D film;
    fabricating a tip on a planar substrate, wherein the tip has a radius that is between 3.6 nm to 10 nm; and
    transferring the indirect band gap 2D film to the tip on the planar substrate by the tip on the planar substrate penetrating the indirect band gap 2D film.

9. The method of claim 8, wherein the planar substrate is one of a planar silicon (100) substrate or a glass substrate.

10. The method of claim 8, wherein the indirect band gap 2D film comprises a epitaxial $WSe_2$.

11. The method of claim 8 further comprising creating an array of sharp tips by forming a hardmask in an array configuration on the planar substrate, and wherein the hardmask is at least one of Chromium, Platinum, or Palladium.

12. The method of claim 11 further comprising etching portions of the planar substrate uncovered by the hardmask, using an etchant material.

13. The method of claim 12, wherein the etchant material is at least one of potassium hydroxide, tetramethyl ammonium hydroxide, hydrofluoric acid, buffered oxide etchant.

14. The method of claim 8, wherein a tip angle associated with the tip is approximately 45.6°.

15. The method of claim 8, wherein the indirect band gap 2D film comprises tungsten diselenide ($WSe_2$).

16. The method of claim 8, wherein the indirect band gap 2D film is 1 to 5 atoms thick.

17. The method of claim 8, wherein each layer of the indirect band gap 2D film is approximately 6.5 Ångström thick.

18. The method of claim 8, wherein transferring occurs subsequent to spin coating the indirect band gap 2D film with a coating material.

19. The method of claim 18, wherein the coating material is at least one of polymethacrylate, polycarbonate, polystyrene, polydimethylsiloxane, or formvar.

20. The method of claim 8, further comprising thermally annealing the indirect band gap 2D firm to the tip on the planar substrate, wherein the indirect band gap 2D film deforms to the 3D film on the tip on the planar substrate due to van der Waals adhesion force.

* * * * *